(12) United States Patent
Koyama

(10) Patent No.: US 6,678,623 B2
(45) Date of Patent: Jan. 13, 2004

(54) FAILURE ANALYSIS DEVICE AND FAILURE ANALYSIS METHOD

(75) Inventor: Tohru Koyama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 378 days.

(21) Appl. No.: 09/907,940

(22) Filed: Jul. 19, 2001

(65) Prior Publication Data

US 2002/0111759 A1 Aug. 15, 2002

(30) Foreign Application Priority Data

Feb. 9, 2001 (JP) .................................. 2001-033848

(51) Int. Cl.[7] .............................................. G01N 37/00
(52) U.S. Cl. ............................ 702/82; 702/58; 702/81; 702/180; 714/738
(58) Field of Search ............................ 714/738; 702/81, 702/82, 58, 180; 716/4; 250/492.2

(56) References Cited

U.S. PATENT DOCUMENTS

| | | | |
|---|---|---|---|
| 5,175,495 A | * 12/1992 | Brahme et al. | 714/738 |
| 5,391,885 A | * 2/1995 | Imataki et al. | 250/492.2 |
| 5,760,892 A | 6/1998 | Koyama | |
| 6,031,985 A | 2/2000 | Yoshida | 714/738 |
| 6,553,546 B1 | * 4/2003 | Murakami | 716/4 |

FOREIGN PATENT DOCUMENTS

| | | |
|---|---|---|
| JP | 10-4128 | 1/1998 |
| JP | 10-223707 | 8/1998 |
| TW | 349252 | 1/1999 |

* cited by examiner

*Primary Examiner*—John Barlow
*Assistant Examiner*—Stephen J. Cherry
(74) *Attorney, Agent, or Firm*—Oblon, Spivak, McClelland, Maier & Neustadt, P.C.

(57) ABSTRACT

A failure analysis device is provided which can realize automatic light emission analysis even when the tested chips have logic LSIs etc. fabricated therein. A comparator (11) compares individual Iddq values (I1) to (In) sequentially provided from a probe card (3) with a threshold (Ith1) provided from a main control unit (7). An abnormality occurrence vector specifying unit (8) receives data (D2) about the results of comparison from the comparator (11) and specifies an abnormality occurrence vector or vectors from among a plurality of test vectors (TB1) to (TBn) on the basis of the data (D2). More specifically, the abnormality occurrence vector specifying unit (8) specifies the test vector as the abnormality occurrence vector when the corresponding detected Iddq value is larger than the threshold (Ith1).

16 Claims, 20 Drawing Sheets

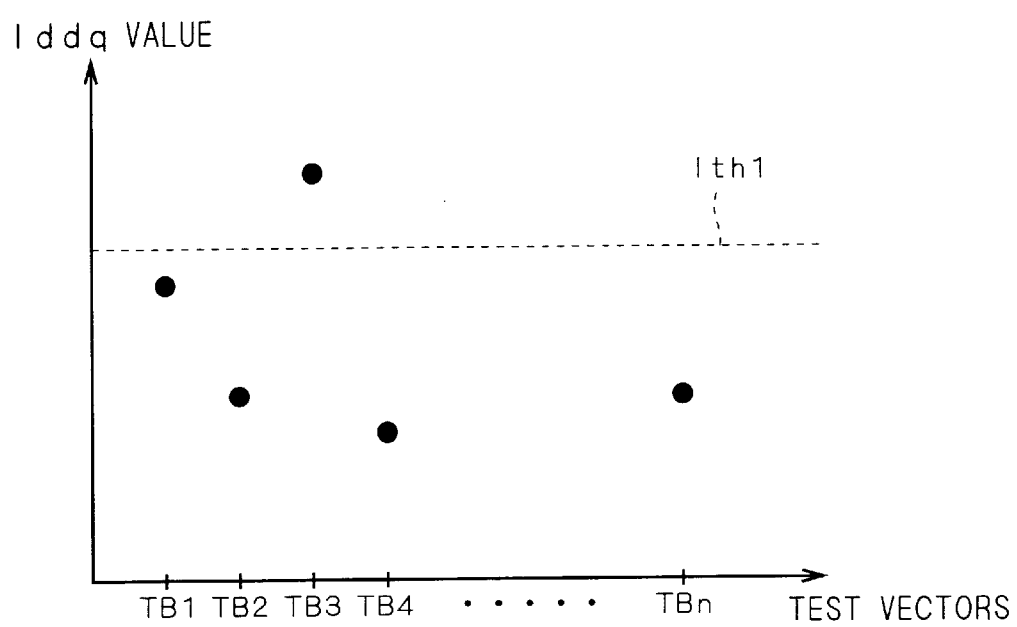
F I G. 3

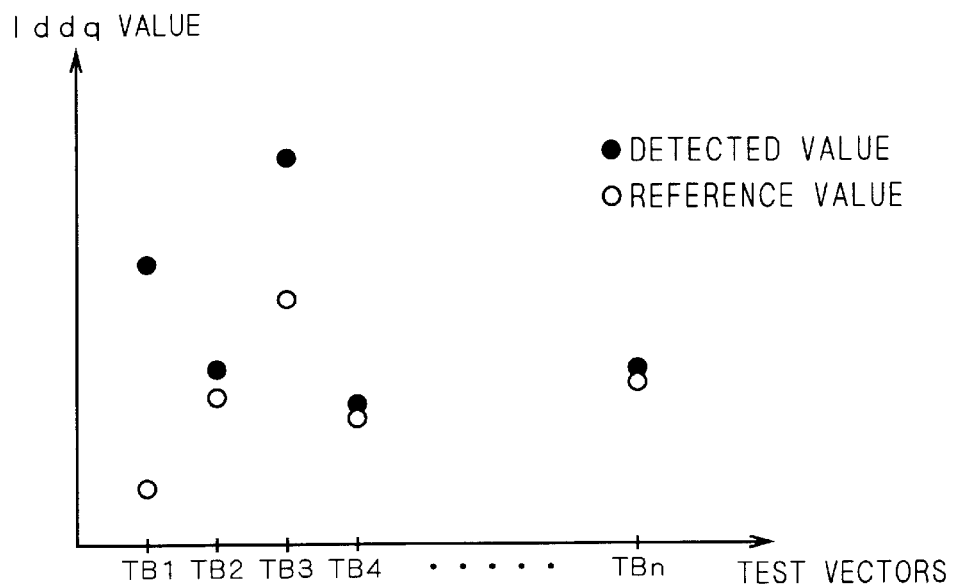
F I G. 6
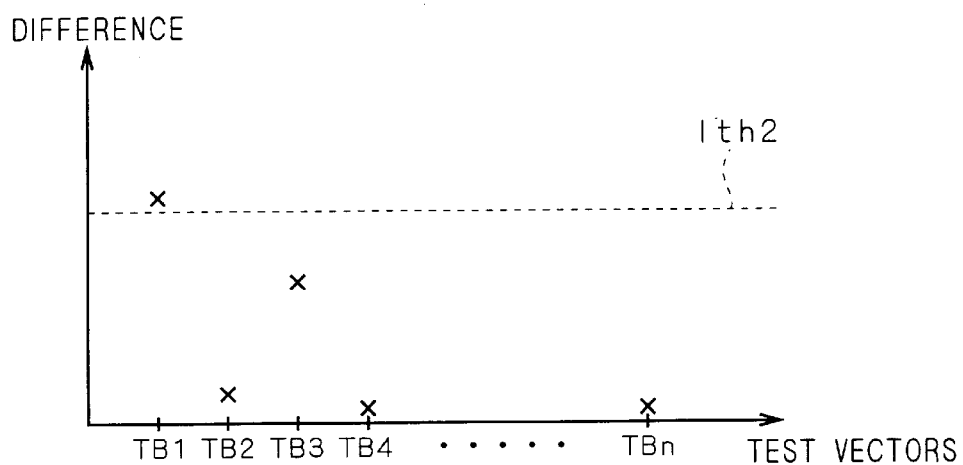
F I G. 7

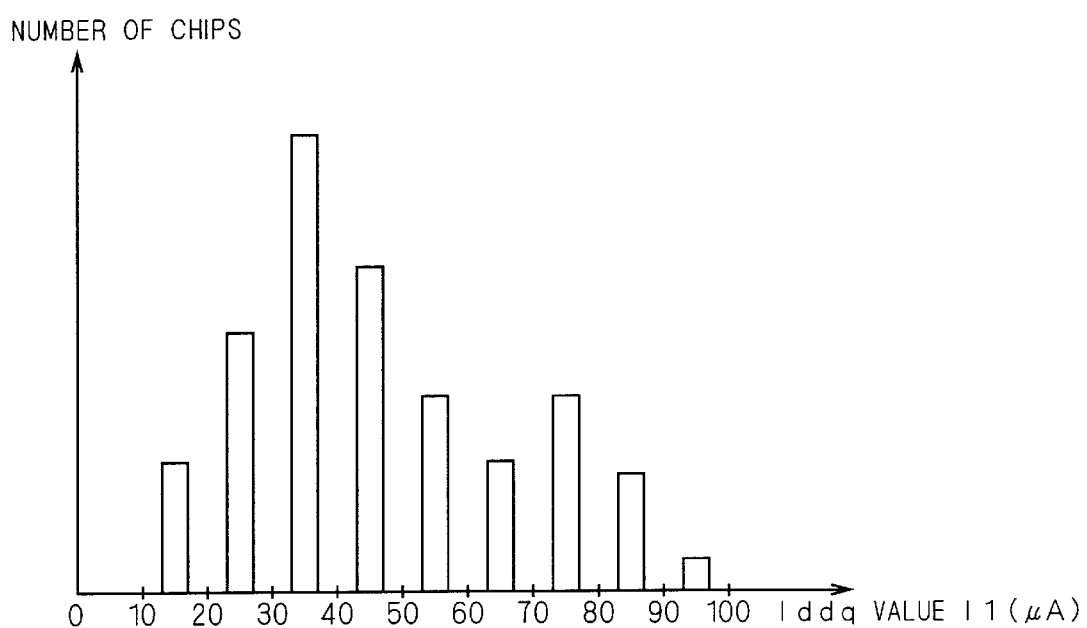
F I G . 1 0

FAILURE ANALYSIS DEVICE AND FAILURE ANALYSIS METHOD

BACKGROUND OF THE INVENTION

1. Field of the Invention

The present invention relates to a failure analysis device and a failure analysis method, and particularly to an automatic failure analysis device and an automatic failure analysis method for examining chips having logic LSIs fabricated therein or chips having system LSIs having logic regions fabricated therein. The present invention relates also to a semiconductor device manufacturing method using the failure analysis method.

2. Description of the Background Art

In the failure analysis of semiconductor devices such as LSIs, light emission analysis is one of the most common analysis methods. In the light emission analysis, a light detecting device which can detect very weak photon-level light is used to detect very weak light emitted at leakage locations so as to determine the failure locations. This technique can be applied not only to analysis of leakage failures such as power-supply leakage, standby leakage, etc. but also to analysis of operation failures accompanied by leakage. The light emission analysis is indispensable analysis means particularly in identifying failure locations in logic LSIs or in logic regions of system LSIs in which electrical testing cannot successfully identify failure locations.

A conventional light emission analysis for examining logic LSIs is now described. FIG. 20 is a block diagram showing the structure of a conventional failure analysis device. The wafer 101 has a matrix of a plurality of chips to be tested (not shown). Each chip has a logic LSI fabricated therein. The wafer 101 is placed on a wafer stage 102.

A known probe card 105 is disposed to face toward the wafer surface of the wafer 101. The probe card 105 has a plurality of probes 106 for making contact with electrode pads formed on the chips. A light detecting device 107 is disposed near the wafer surface of the wafer 101. The light detecting device 107 is connected to a failure location analysis unit 108. The conventional failure analysis device also has a recording unit 103 connected to the probe card 105 and a main control unit 104 connected to the probe card 105 and the wafer stage 102.

FIG. 21 is a flowchart showing the procedure of light emission analysis using the conventional failure analysis device shown in FIG. 20. First, in the step SP7A, an operator enters measurement conditions into the failure analysis device. More specifically, the operator enters data D101 about conditions to be individually set into the main control unit 104, so as to specify a plurality of wafers to be tested among a plurality of wafers stored in a wafer cassette, to specify a plurality of chips to be tested among a plurality of chips formed on each wafer, to specify test conditions about the test pattern, voltage application, etc.

Next, in the step SP7B, the first wafer 101, or a wafer to be tested first among the plurality of wafers to be tested, is placed on the wafer stage 102. Next, in the step SP7C, the wafer stage 102 moves the wafer 101 on the basis of a control signal S101 provided from the main control unit 104 to align the first chip, or a chip to be tested first among the plurality of chips to be tested on the wafer 101, with the light detecting device 107. The probes 106 of the probe card 105 are then set into contact with given electrode pads formed on the chip.

Next, in the step SP7D, the probe card 105 applies a test pattern composed of a plurality of test vectors TB1 to TBn to the chip on the basis of a control signal S102 provided from the main control unit 104. Next, in the step SP7E, the probe card 105 sequentially detects quiescent power supply currents (Iddq) which flow when the individual test vectors TB1 to TBn are applied. The recording unit 103 then records the Iddq values I1 to In sequentially provided from the probe card 105.

Next, in the step SP7F, the operator refers to the Iddq values I1 to In recorded in the recording unit 103 to identify an abnormality occurrence vector. FIG. 22 is a diagram used to explain a method in which the operator identifies the abnormality occurrence vector. In the diagram, the horizontal axis shows the test vectors TB1 to TBn and the vertical axis shows the current value. The test vectors are sequentially applied upon each input of a clock and the logic state changes. A large switching current flows at the instant the logic state changes and then the current value settles in quiescent state. The power-supply current which flows in this quiescent state is the quiescent power supply current (Iddq). The waveform shown in FIG. 22 is recorded in the recording unit 103 and the operator refers to this waveform and specifies a test vector with which the Iddq value shows an abnormal value as the abnormality occurrence vector (the test vector TB3 in the example shown in FIG. 22).

Next, in the step SP7G, the operator enters data D102 about the specified abnormality occurrence vector into the main control unit 104. The probe card 105 then applies again the test pattern from the first test vector TB1 to the abnormality occurrence vector to the chip on the basis of a control signal S103 provided from the main control unit 104 and holds the state in which the abnormality occurrence vector is applied to the chip.

Next, in the step SP7H, the failure location on the chip is located through the light emission analysis. More specifically, with the abnormality occurrence vector applied to the chip, the light detecting device 107 detects light emission from the chip. The failure location analysis unit 108 then locates the failure location on the chip on the basis of data T about the location of the light emission provided from the light detecting device 107.

Next, in the step SP7I, the main control unit 104 checks whether the chip currently in alignment is the last chip. When the step SP7I provides a decision "NO," the flow moves to the step SP7J, where the next chip is aligned. The operations in and after the step SP7D are then applied to the aligned chip.

When the decision of the step SP7I is "YES," the flow goes to the step SP7K, where the main control unit 104 checks whether the wafer 101 currently placed on the wafer stage 102 is the last wafer. When the step SP7K shows "NO," the flow moves to the step SP7L, where the next wafer is placed on the wafer stage 102. The operations in and after the step SP7C are then applied to that wafer.

When the decision made in the step SP7K is "YES," the test is ended.

As explained above, the light emission analysis of logic LSIs requires that the light emission analysis be executed with the abnormality occurrence vector applied to the chip. However, with the conventional failure analysis device, the operator must refer to the current waveform recorded in the recording unit 103 to specify the abnormality occurrence vector.

Devices for automatically applying the light emission analysis to all or part of chips formed on a wafer include those disclosed in Japanese Patent Application Laid-Open Nos. 10-4128 (1998) and 10-223707 (1998), some of which are used in practice. However, these devices are designed to apply automatic light emission analysis to a plurality of chips under predetermined fixed conditions. Therefore these devices cannot be directly applied to the light emission analysis of logic LSIs in which the measurement conditions must be varied chip by chip because different abnormality occurrence vectors are specified among different chips.

SUMMARY OF THE INVENTION

According to a first aspect of the present invention, a failure analysis device comprises: a test pattern applying portion for applying a test pattern composed of a plurality of test vectors to a test target; an abnormality occurrence vector specifying portion for specifying an abnormality occurrence vector which can activate a failure present in the test target from among the test pattern on the basis of detected values of quiescent power supply currents which flow in the test target respectively when the plurality of test vectors are applied; and a failure location analysis portion for analyzing the location of the failure in the test target by detecting light emission from the test target with the abnormality occurrence vector applied to the test target.

Preferably, according to a second aspect, in the failure analysis device of the first aspect, the abnormality occurrence vector specifying portion specifies the abnormality occurrence vector on the basis of results of comparison between a given threshold and the detected values of the quiescent power supply currents.

Preferably, according to a third aspect, in the failure analysis device of the first aspect, the abnormality occurrence vector specifying portion specifies the abnormality occurrence vector on the basis of results of comparison between a given threshold and differences between normal values of the quiescent power supply currents which flow in the test target having no failure and the detected values of the quiescent power supply currents.

Preferably, according to a fourth aspect, in the failure analysis device of the first aspect, the test target is each of a plurality of semiconductor chips formed on a semiconductor wafer, and the abnormality occurrence vector specifying portion specifies the abnormality occurrence vector on the basis of results of comparison between a given threshold and differences between given reference values and the detected values of the quiescent power supply currents, and wherein the failure analysis device further comprises a reference value setting portion for setting the reference values by statistically processing the detected values of the quiescent power supply currents.

Preferably, according to a fifth aspect, the failure analysis device of the third or fourth aspect further comprises a failure number estimating portion for estimating the number of the failures present in the test target on the basis of the differences.

Preferably, according to a sixth aspect, the failure analysis device of the fourth aspect further comprises a failure number estimating portion for estimating the number of the failures present in the test target on the basis of the differences, and a display portion for displaying a wafer map which shows the number of the failures in each of the plurality of semiconductor chips, the wafer map being generated on the basis of the results of the estimation performed by the failure number estimating portion.

According to a seventh aspect of the present invention, a failure analysis device comprises: a failure number estimating portion for estimating the number of failures present in each of a plurality of semiconductor chips; a functional test device for carrying out a functional test about the plurality of semiconductor chips by using a test pattern generated on the basis of circuit information about the plurality of semiconductor chips, a test result selecting portion for selecting test results about semiconductor chips in which the number of the failures is estimated to be one from among a plurality of test results of the functional test about the plurality of semiconductor chips on the basis of the results of the estimation performed by the failure number estimating portion; and a failure node estimating portion for estimating failure nodes in the semiconductor chips on the basis of the test results selected by the test result selecting portion and a failure dictionary generated on the basis of the circuit information about the plurality of semiconductor chips.

Preferably, according to an eighth aspect, the failure analysis device of the seventh aspect further comprises a light emission analysis device for analyzing locations of the failures in the semiconductor chips by detecting light emission from the semiconductor chips, and a detailed analysis portion for analyzing in detail the locations of the failure nodes on the basis of the results of the analysis performed by the light emission analysis device and the results of the estimation performed by the failure node estimating portion.

According to a ninth aspect of the present invention, a failure analysis method comprises the steps of: (a) applying a test pattern composed of a plurality of test vectors to a test target; (b) specifying an abnormality occurrence vector which can activate a failure present in the test target from among the test pattern on the basis of detected values of quiescent power supply currents which flow in the test target when the plurality of test vectors are applied; and (c) analyzing the location of the failure in the test target by detecting light emission from the test target with the abnormality occurrence vector applied to the test target.

Preferably, according to a tenth aspect, in the step (b) of the failure analysis method of the ninth aspect, the abnormality occurrence vector is specified on the basis of results of comparison between a given threshold and the detected values of the quiescent power supply currents.

Preferably, according to an eleventh aspect, in the step (b) of the failure analysis method of the ninth aspect, the abnormality occurrence vector is specified on the basis of results of comparison between a given threshold and differences between normal values of the quiescent power supply currents which flow in the test target having no failure and the detected values of the quiescent power supply currents.

Preferably, according to a twelfth aspect, in the failure analysis method of the ninth aspect, the test target is each of a plurality of semiconductor chips formed on a semiconductor wafer, and in the step (b), the abnormality occurrence vector is specified on the basis of results of comparison between a given threshold and differences between given reference values and the detected values of the quiescent power supply currents, and wherein the failure analysis method further comprises a step (d) of setting the reference values by statistically processing the detected values of the quiescent power supply currents.

Preferably, according to a thirteenth aspect, the failure analysis method of the eleventh or twelfth aspect further comprises a step (e) of estimating the number of the failures present in the test target on the basis of the differences.

Preferably, according to a fourteenth aspect, the failure analysis method of the twelfth aspect further comprises the steps of (e) estimating the number of the failures present in the test target on the basis of the differences, and (f) displaying a wafer map which shows the number of the failures in each of the plurality of semiconductor chips, the wafer map being generated on the basis of the results of the estimation performed in the step (e).

According to a fifteenth aspect of the present invention, a failure analysis device comprises: a failure number estimating portion for estimating the number of failures present in each of a plurality of semiconductor chips; a functional test device for carrying out a functional test about the plurality of semiconductor chips by using a test pattern generated on the basis of circuit information about the plurality of semiconductor chips, a test result selecting portion for selecting test results about semiconductor chips in which the number of the failures is estimated to be one from among a plurality of test results of the functional test about the plurality of semiconductor chips on the basis of the results of the estimation performed by the failure number estimating portion; and a failure node estimating portion for estimating failure nodes in the semiconductor chips on the basis of the test results selected by the test result selecting portion and a failure dictionary generated on the basis of the circuit information about the plurality of semiconductor chips.

Preferably, according to a sixteenth aspect, the failure analysis device of the fifteenth aspect further comprises, a light emission analysis device for analyzing locations of the failures in the semiconductor chips by detecting light emission from the semiconductor chips, and a detailed analysis portion for analyzing in detail the locations of the failure nodes on the basis of the results of the analysis performed by the light emission analysis device and the results of the estimation performed by the failure node estimating portion.

A seventeenth aspect of the present invention is directed to a method of manufacturing a semiconductor device by using one of the failure analysis methods of the ninth to fourteenth aspects of the present invention.

According to the first aspect of the present invention, the abnormality occurrence vector specifying portion specifies the abnormality occurrence vector item by item. Therefore the efficiency of the failure analysis can be improved by realizing automatic wafer-level light emission analysis even when the tested items are chips having logic LSIs fabricated therein or chips having system LSIs having logic regions fabricated therein which require that the test vector applied during the light emission analysis be changed chip by chip.

According to the second aspect of the present invention, the abnormality occurrence vector specifying portion can automatically specify the abnormality occurrence vectors on the basis of the results of the comparison between the detected values of the quiescent power supply current and the given threshold.

According to the third aspect of the present invention, the abnormality occurrence vector specifying portion can automatically and accurately specify the abnormality occurrence vectors on the basis of the results of the comparison between the given threshold and the differences between the normal values of the quiescent power supply currents and their detected values.

According to the fourth aspect of the present invention, the given reference values can be automatically set by utilizing the test target semiconductor wafer, without performing simulation or actual measurement with normal chips.

According to the fifth aspect of the present invention, a wafer map showing the numbers of failures in the individual semiconductor chips can be generated on the basis of the results of the estimation performed by the failure number estimating portion.

According to the sixth aspect of the present invention, the distribution of failure locations in the wafer can be easily grasped visually by referring to the wafer map.

According to the seventh aspect of the present invention, the failure node estimating portion estimates failure nodes on the basis of the failure dictionary and the test results only about semiconductor chips for which the number of failures has been estimated to be one, so that the accuracy of the failure node diagnosis performed by the failure node estimating portion can be enhanced.

According to the eighth aspect of the present invention, the detailed analysis portion analyzes in detail the failure locations on the basis of a combination of the results of the analysis performed by the light emission analysis device and the results of the estimation performed by the failure node estimating portion, so that it can accurately locate the failure locations.

According to the ninth aspect of the present invention, in the step (b), the abnormality occurrence vector is specified item by item on the basis of the detected values of the quiescent power supply currents which flow in the test target. Therefore the efficiency of the failure analysis can be improved by realizing automatic wafer-level light emission analysis even when the tested items are chips having logic LSIs fabricated therein or chips having system LSIs having logic regions fabricated therein which require that the test vector applied during the light emission analysis be changed chip by chip.

According to the tenth aspect of the present invention, the abnormality occurrence vectors can be automatically specified on the basis of the results of the comparison between the detected values of the quiescent power supply currents and the given threshold.

According to the eleventh aspect of the present invention, the abnormality occurrence vectors can be automatically and accurately specified on the basis of the results of the comparison between the given threshold and the differences between the normal values of the quiescent power supply currents and their detected values.

According to the twelfth aspect of the present invention, the given reference values can be automatically set by utilizing the test target semiconductor wafer, without performing simulation or actual measurement with normal chips.

According to the thirteenth aspect of the present invention, a wafer map showing the numbers of failures in the individual semiconductor chips can be generated on the basis of the results of the estimation of the number of failures.

According to the fourteenth aspect of the present invention, the distribution of failure locations in the wafer can be easily grasped visually by referring to the wafer map.

According to the fifteenth aspect of the present invention, failure nodes are estimated on the basis of the failure dictionary and the test results only about semiconductor chips for which the number of failures has been estimated to be one, so that the accuracy of the failure node diagnosis in the step (d) can be enhanced.

According to the sixteenth aspect of the present invention, the failure locations are analyzed in detail on the basis of a combination of the results of the light emission analysis in the step (e) and the results of the estimation of the failure node in the step (d), so that the failure locations can be accurately located.

According to the seventeenth aspect of the present invention, the efficiency of manufacturing a semiconductor device can be improved.

The present invention has been made to solve the problem explained earlier, and an object of the present invention is to obtain a wafer-level failure analysis device and failure analysis method in which the light emission analysis can be automatically performed even when the tested chips have logic LSIs etc. fabricated therein.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a graph used to explain comparison operation performed by the comparator;

FIG. 6 is a graph used to explain subtraction operation performed by the subtracter;

FIG. 7 is a graph used to explain comparison operation performed by the comparator;

FIG. 10 is a graph showing an example of a generated histogram;

DESCRIPTION OF THE PREFERRED EMBODIMENTS

First Preferred Embodiment

Figure 1:
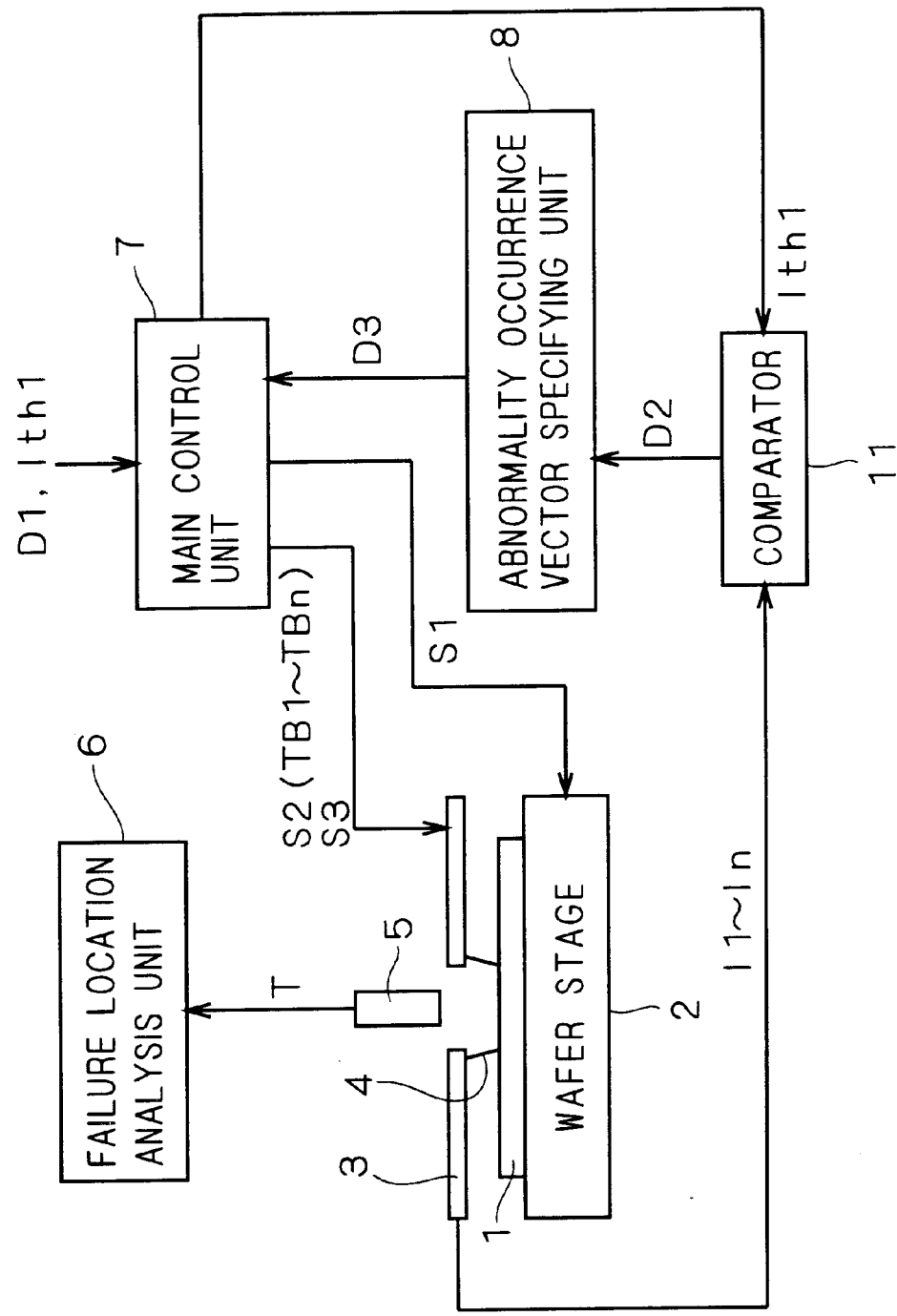
FIG. 1 is a block diagram showing the structure of a failure analysis device according to a first preferred embodiment of the present invention.

FIG. 1 is a block diagram showing the structure of a failure analysis device according to a first preferred embodiment of the present invention. The wafer 1 has a matrix of a plurality of chips to be tested (not shown). Each chip has a logic LSI fabricated therein. Or each chip has a system LSI having logic region fabricated therein. The wafer 1 is placed on the wafer mount surface of the wafer stage 2. The wafer stage 2 has a function of moving the wafer 1 in X, Y and Z directions, with the Z direction defined as the direction normal to the wafer mount surface.

A known probe card 3 is disposed to face toward the wafer surface of the wafer 1. The probe card 3 has a plurality of probes 4 for making contact with electrode pads formed on the chip. A known light detecting device 5 is also disposed near the wafer surface of the wafer 1; the light detecting device 5 has a photodetector, a collective lens, etc. which can detect very weak photon-level light. The light detecting device 5 is connected to a failure location analysis unit 6. The failure analysis device of the first preferred embodiment also comprises a comparator 1 connected to the probe card 3, an abnormality occurrence vector specifying unit 8 connected to the comparator 11, and a main control unit 7 connected to the wafer stage 2, probe card 3, comparator 11 and abnormality occurrence vector specifying unit 8.

Figure 2:
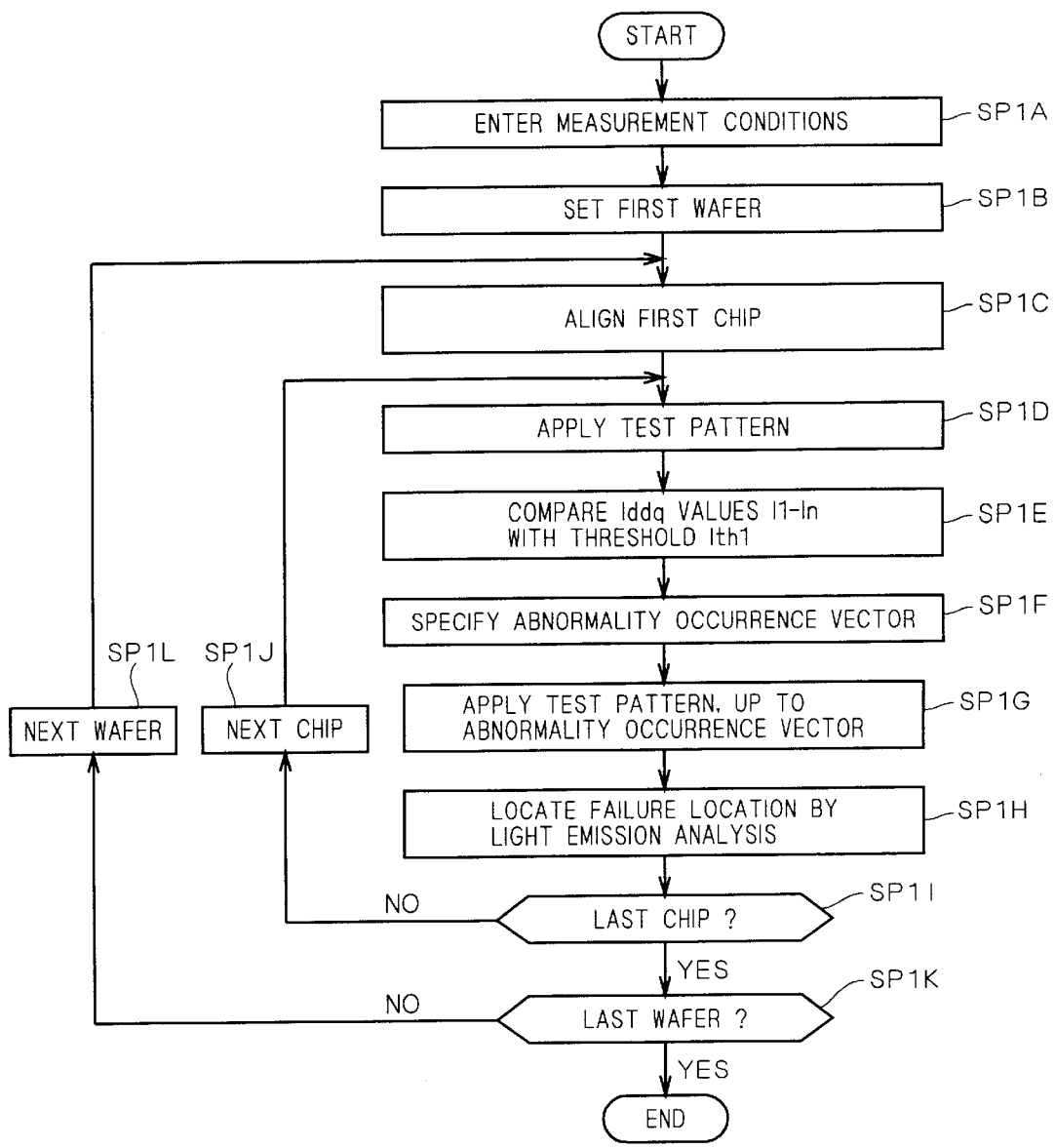
FIG. 2 is a flowchart showing the operation flow of the failure analysis device of the first preferred embodiment of the invention.

FIG. 2 is a flowchart showing the operation flow of the failure analysis device of the first preferred embodiment. The failure analysis method of the first preferred embodiment is now described referring to FIGS. 1 and 2. First, in the step SP1A, an operator enters various measurement conditions into the failure analysis device. More specifically, the operator enters data D1 about conditions to be individually set and a given threshold Ith1 into the main control unit 7; the data D1 specifies a plurality of wafers to be tested among a plurality of wafers stored in a wafer cassette, specifies a plurality of chips to be tested among the plurality of chips formed on each wafer, and specifies test conditions about the test pattern, voltage application, etc.

Next, in the step SP1B, the first wafer 1, or a wafer to be tested first among the plurality of wafers specified in the step SP1A, is placed on the wafer mount surface of the wafer stage 2 by a known wafer transfer device etc. not shown. Next, in the step SP1C, the wafer stage 2 moves the wafer 1 in the X and Y directions on the basis of a control signal S1 provided from the main control unit 7 to align the first chip, or a chip to be tested first among the plurality of chips specified in the step SP1A, with the light detecting device 5. The wafer stage 2 then moves the wafer 1 in the Z direction to set the probes 4 of the probe card 3 into contact with given electrode pads formed on the chip.

Next, in the step SP1D, the probe card 3 applies a test pattern composed of a plurality of test vectors TB1 to TBn (n: an integer of 2 or larger) to the chip on the basis of a control signal S2 provided from the main control unit 7. Next, in the step SP1E, the probe card 3 detects quiescent power supply currents (Iddq) as the individual test vectors TB1 to TBn are applied. In this specification, a group of a plurality of test vectors is defined as a test pattern. The test pattern can be generated with a known test pattern generating tool (not shown) on the basis of circuit information, for example. Application of the test pattern causes a larger leakage current to occur at a failure location than at normal locations free from failures. For example, when the application of a test vector causes a potential difference to occur in a location where interconnections are shorted, a larger leakage current flows in that shorted location than in normal locations.

When it is assumed that the chip contains no portion which is always operating, then the value of the detected quiescent power supply current is approximately equal to the sum of the micro leakage currents (Ioff) of off-state transistors if the chip has no failure location. On the other hand, when the chip has a failure location, the value of the detected quiescent power supply current is equal to the sum total of the micro leakage current sum and the large leakage current flowing due to the failure.

The comparator 11 then compares each of the Iddq values I1 to In sequentially provided from the probe card 3 with the threshold Ith1 provided from the main control unit 7. FIG. 3 is a graph used to explain the comparison performed by the comparator I1. The horizontal axis in the graph shows the test vectors TB1 to TBn and the vertical axis shows the Iddq values I1 to In corresponding to the respective test vectors TB1 to TBn. Referring to FIG. 3, for example, the Iddq values detected upon application of the test vectors TB1, TB2, etc. are smaller than the threshold Ith1. On the other hand, the Iddq value detected upon application of the test vector TB3 is larger than the threshold Ith1. The comparator 11 may be set to collectively compare the Iddq values I1 to In with the threshold Ith1 after having obtained all Iddq values I1 to In for one chip (or one wafer).

Next, in the step SP1F, the abnormality occurrence vector specifying unit 8 obtains data D2 about the comparison results from the comparator 11 and identifies an abnormality occurrence vector among the plurality of test vectors TB1 to TBn on the basis of the data D2. Among the plurality of test vectors TB1 to TBn, the "abnormality occurrence vector" is a test vector which can activate a failure node. More specifically, the abnormality occurrence vector specifying unit 8 specifies a test vector or a plurality of test vectors as the abnormality occurrence vector or vectors when the corresponding Iddq value is larger than the threshold Ith1 (the test vector TB3 in the example shown in FIG. 3).

Next, in the step SP1G, the test pattern from the first test vector TB1 to the abnormality occurrence vector are sequentially applied to the chip again and the test pattern is maintained with the abnormality occurrence vector applied to the chip. More specifically, the main control unit 7 obtains data D3 about the abnormality occurrence vector from the abnormality occurrence vector specifying unit 8 and provides a control signal S3 to the probe card 3 to direct it to apply the test pattern from the first test vector TB1 to the abnormality occurrence vector to the chip. The probe card 3 then sequentially applies the test pattern from the test vector TB1 to the abnormality occurrence vector to the chip on the basis of the control signal S3 and holds the test pattern with the abnormality occurrence vector applied to the chip.

Next, in the step SP1H, the failure location on the chip is located through light emission analysis. More specifically, with the abnormality occurrence vector applied to the chip, the light detecting device 5 detects light emission from the chip. The failure location analysis unit 6 then finds the failure location on the chip on the basis of data T about the light emission location provided from the light detecting device 5.

Next, in the step SP1I, the main control unit 7 checks whether the chip in alignment at present is the last chip, i.e. whether all chips specified in the step SP1A have been tested. When the step SP1I provides a decision "NO," the flow moves to the step SP1J, where the next chip is aligned. The operations in and after the step SP1D are then applied to the aligned chip.

When the decision of the step SP1I is "YES," the flow moves to the step SP1K, where the main control unit 7 checks whether the wafer 1 currently placed on the wafer stage 2 is the last wafer, i.e. whether the wafers specified in the step SP1A have all been tested as explained above. When the decision of the step SP1K is "NO," the flow moves to the step SP1L, where the next wafer is placed on the wafer stage 2. The operations in and after the step SP1C are then applied to that wafer.

When the decision made in the step SP1K is "YES," the test is ended.

While the description above has shown an example in which the quiescent power supply current is measured about all test vectors TB1 to TBn, the quiescent power supply current may be measured only about some test vectors extracted from among all test vectors TB1 to TBn. This applies also to a second preferred embodiment described later.

As explained so far, according to the failure analysis device and the failure analysis method of the first preferred embodiment, the abnormality occurrence vector specifying unit 8 automatically specifies one or more abnormality occurrence vectors for each chip formed on the wafer 1 on the basis of the results of comparison between the detected Iddq values I1 to In and the given threshold Ith1. Then the failure location or locations on the chip are analyzed through light emission analysis, with the specified abnormality occurrence vector being applied to the chip. The efficiency of the failure analysis can thus be improved by realizing automatic wafer-level light emission analysis even when the tested items are chips having logic LSIs fabricated therein or chips having system LSIs with logic regions fabricated therein which require that the test vector applied during the light emission analysis be varied chip by chip.

Second Preferred Embodiment

Figure 4:
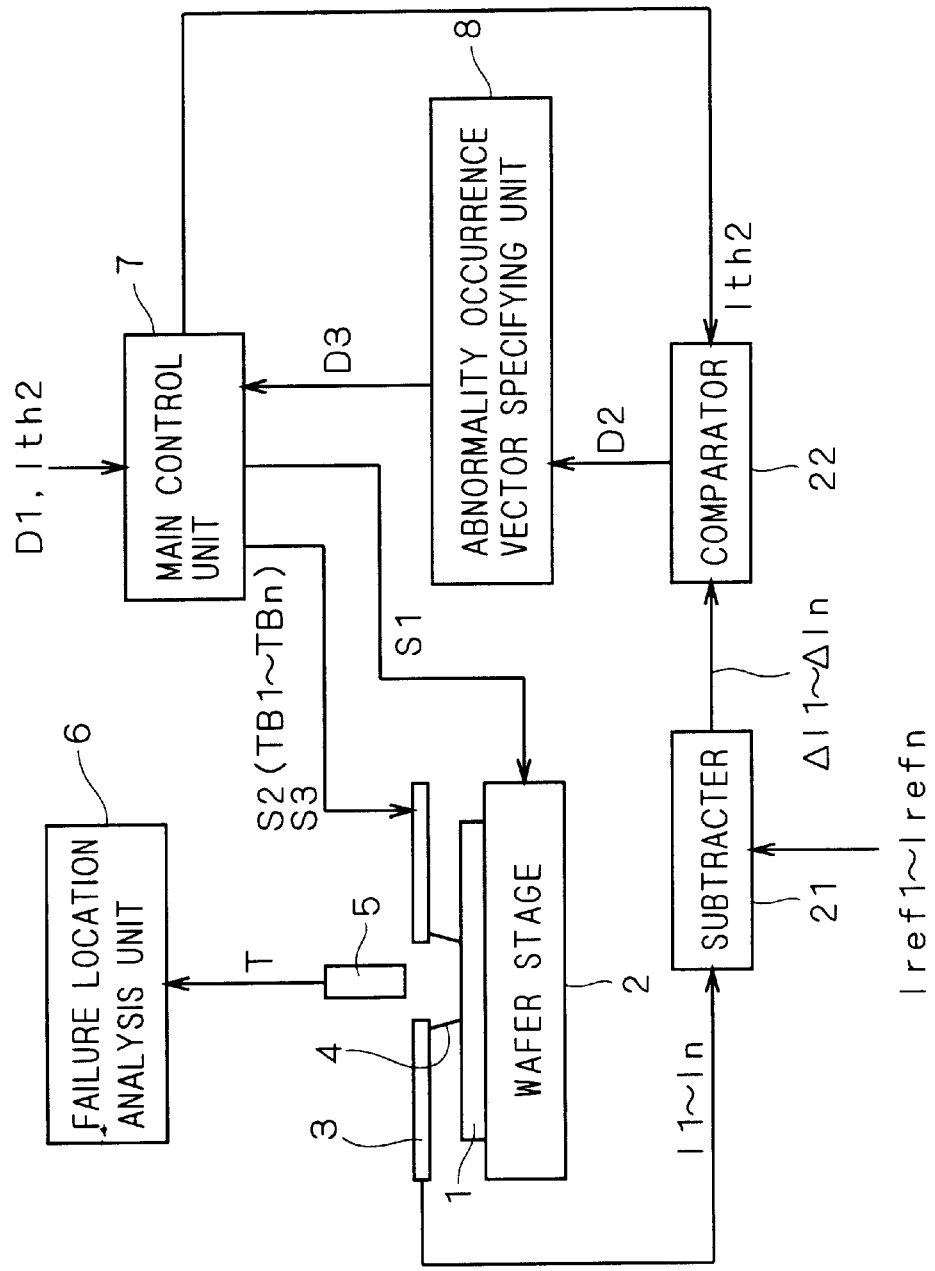
FIG. 4 is a block diagram showing the structure of a failure analysis device according to a second preferred embodiment of the present invention.

FIG. 4 is a block diagram showing the structure of a failure analysis device according to a second preferred embodiment of the present invention. A subtracter 21 is connected to the probe card 3 and the subtracter 21 has its output connected to an input of a comparator 22. In other respects, the structure of the failure analysis device of the second preferred embodiment is the same as that of the failure analysis device shown in FIG. 1 in the first preferred embodiment.

Figure 5:
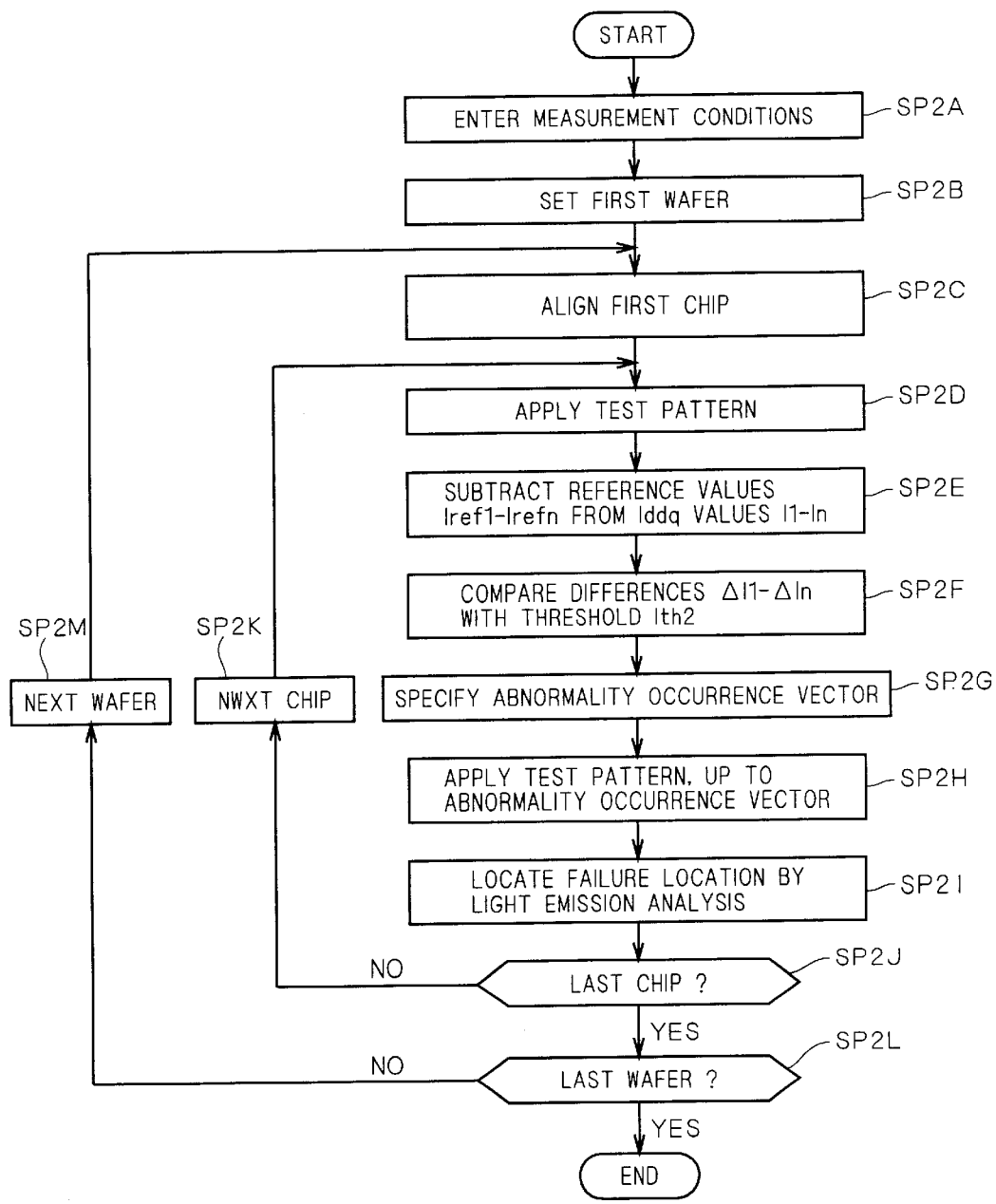
FIG. 5 is a flowchart showing the operation flow of the failure analysis device of the second preferred embodiment of the invention.

FIG. 5 is a flowchart showing the operation flow of the failure analysis device of the second preferred embodiment. The failure analysis method of the second preferred embodiment is now described referring to FIGS. 4 and 5. First, in the step SP2A, the operator enters measurement conditions into the failure analysis device. More specifically, the operator enters the aforementioned data D1 and a given threshold Ith2 into the main control unit 7.

Next, in the step SP2B, as in the step SP1B in the failure analysis method of the first preferred embodiment, the first wafer 1 is placed on the wafer stage 2. Next, in the step SP2C, as in the step SP1C of the failure analysis method of the first preferred embodiment, the first chip is aligned and then the probes 4 of the probe card 3 are set into contact with given electrode pads formed on the chip. Next, in the step SP2D, as in the step SP1D of the failure analysis method of the first preferred embodiment, the probe card 3 applies the test pattern composed of a plurality of test vectors TB1 to TBn to the chip.

Next, in the step SP2E, the probe card 3 sequentially detects the quiescent power supply currents which flow when the respective test vectors TB1 to TBn are applied. Then the subtracter 21 subtracts given reference values Iref1 to Irefn respectively from the Iddq values I1 to In sequentially provided from the probe card 3. In the second preferred embodiment, the reference values Iref1 to Irefn are normal values of the quiescent power supply currents which flow when the respective test vectors TB1 to TBn are applied to a normal chip having no failure. The subtracter 21 may be set to collectively perform the subtraction of the reference values Iref1 to Irefn from the Iddq values I1 to In after having obtained all Iddq values I1 to In for one chip (or one wafer).

FIG. 6 is a graph used to explain the subtracting operation of the subtracter 21. In the graph, the horizontal axis shows the test vectors TB1 to TBn and the vertical axis shows the detected values (black dots) and the reference values (white dots) of the Iddq values corresponding to the respective test vectors TB1 to TBn. Since the circuit condition (on/off of transistors) differs depending on the contents of the test vector applied to the chip, the reference values Iref1 to Irefn about the test vectors TB1 to TBn differ as shown in FIG. 6. The reference values Iref1 to Irefn are previously obtained for the respective test vectors TB1 to TBn by simulation or by actual measurement to normal chips. The subtracter 21 subtracts the reference values Iref1 to Irefn respectively from the detected Iddq values I1 to In to obtain the differences ΔI1 to ΔIn about the test vectors TB1 to TBn.

Next, in the step SP2F, the comparator 22 compares each of the differences ΔI1 to ΔIn sequentially provided from the subtracter 21 with the threshold Ith2 provided from the main control unit 7. FIG. 7 is a graph used to explain the comparison operation by the comparator 22. In the graph, the horizontal axis shows the test vectors TB1 to TBn and the vertical axis shows the differences ΔI1 to ΔIn respectively about the test vectors TB1 to TBn. Referring to FIG. 7, for example, the differences (ΔI2 and ΔI3) about the test vectors TB2 and TB3 are smaller than the threshold Ith2. On the other hand, the difference (ΔI1) about the test vector TB1 is larger than the threshold Ith2. The comparator 22 may be set to collectively compare the differences ΔI1 to ΔIn with the threshold Ith2 after having obtained all differences ΔI1 to ΔIn about one chip (or one wafer).

Next, in the step SP2G, the abnormality occurrence vector specifying unit 8 obtains data D2 about the results of the comparison from the comparator 22 and identifies an abnormal occurrence vector from among the plurality of test vectors TB1 to TBn. More specifically, the abnormality occurrence vector specifying unit 8 identifies a test vector or test vectors which provide difference ΔI larger than the threshold Ith2 as the abnormality occurrence vector(s) (the test vector TB1 in the example shown in FIG. 7).

Next, in the step SP2H, as in the step SP1G of the failure analysis method of the first preferred embodiment, the test pattern from the first test vector TB 1 to the abnormality occurrence vector are sequentially applied to the chip again and the test pattern is maintained with the abnormality occurrence vector applied to the chip. In the example shown in FIG. 7, the test vector TB1 is applied to the chip and this state is maintained. Next, in the step SP2I, as in the step SP1H of the failure analysis method of the first preferred embodiment, the failure location on the chip is located through light emission analysis.

Next, in the step SP2J, as in the step SP 1I of the failure analysis method of the first preferred embodiment, the main control unit 7 checks whether the chip presently in alignment is the last chip. When the decision is "NO," the flow moves to the step SP2K, where the next chip is aligned and the operations in and after the step SP2D are then applied to the aligned chip.

When the decision of the step SP2J is "YES," the flow moves to the step SP2L, where the main control unit 7 checks whether the wafer 1 currently placed on the wafer stage 2 is the last wafer. If the decision is "NO," the flow moves to the step SP2M, where the next wafer is placed on the wafer stage 2 and the operations in and after the step SP2C are then applied to that wafer.

When the decision made in the step SP2L is "YES," the test is ended.

As explained so far, according to the failure analysis device and the failure analysis method of the second preferred embodiment, as in the failure analysis device and the failure analysis method of the first preferred embodiment, the efficiency of the failure analysis can thus be improved by realizing automatic wafer-level light emission analysis even when the tested items are chips having logic LSIs or chips having system LSIs with logic regions.

Moreover, as compared with the failure analysis device and the failure analysis method of the first preferred embodiment, the failure analysis device and the failure analysis method of the second preferred embodiment provides higher accuracy in specifying appropriate abnormal occurrence vectors. The reason is now explained. That is to say, in the failure analysis device and the failure analysis method of the first preferred embodiment, the threshold Ith1 must be set on the basis of the largest reference value (Iref3 in the example shown in FIG. 3). Therefore, when a test vector having a small reference value (e.g. the test vector TB1) is the abnormality occurrence vector which can activate a failure node, the detected Iddq value (e.g. I1) is small since the original reference value is small, and as a result the device may fail to identify this test vector as the abnormality occurrence vector.

Further, as the number of nodes increases due to size reduction or higher integration of the LSIs, the sum of micro leakage currents (Ioff) of off-state transistors increases, too. Then the amount of the increase of the leakage current caused by the failure occupies a smaller ratio in the detected quiescent power supply current, so that the failure analysis device of the first preferred embodiment may offer a difficulty in setting the threshold Ith1.

On the other hand, the failure analysis device and the failure analysis method of the second preferred embodiment subtracts the reference values Iref1 to Irefn from the detected Iddq values I1 to In and compares the differences ΔI1 to ΔIn with the given threshold Ith2 to specify the abnormality occurrence vector. It thus compares the value of the increase of the leakage current caused by the presence of failure with the given threshold value Ith2, so that the abnormality occurrence vectors can be specified more accurately regardless of the magnitude of the original reference values Iref1 to Irefn.

Third Preferred Embodiment

While the failure analysis device of the second preferred embodiment previously obtains the reference values (normal values) Iref1 to Irefn by simulation or by actual measurement with normal chips, a third preferred embodiment shows a failure analysis device which can set the reference values Iref1 to Irefn within the device.

Figure 8:
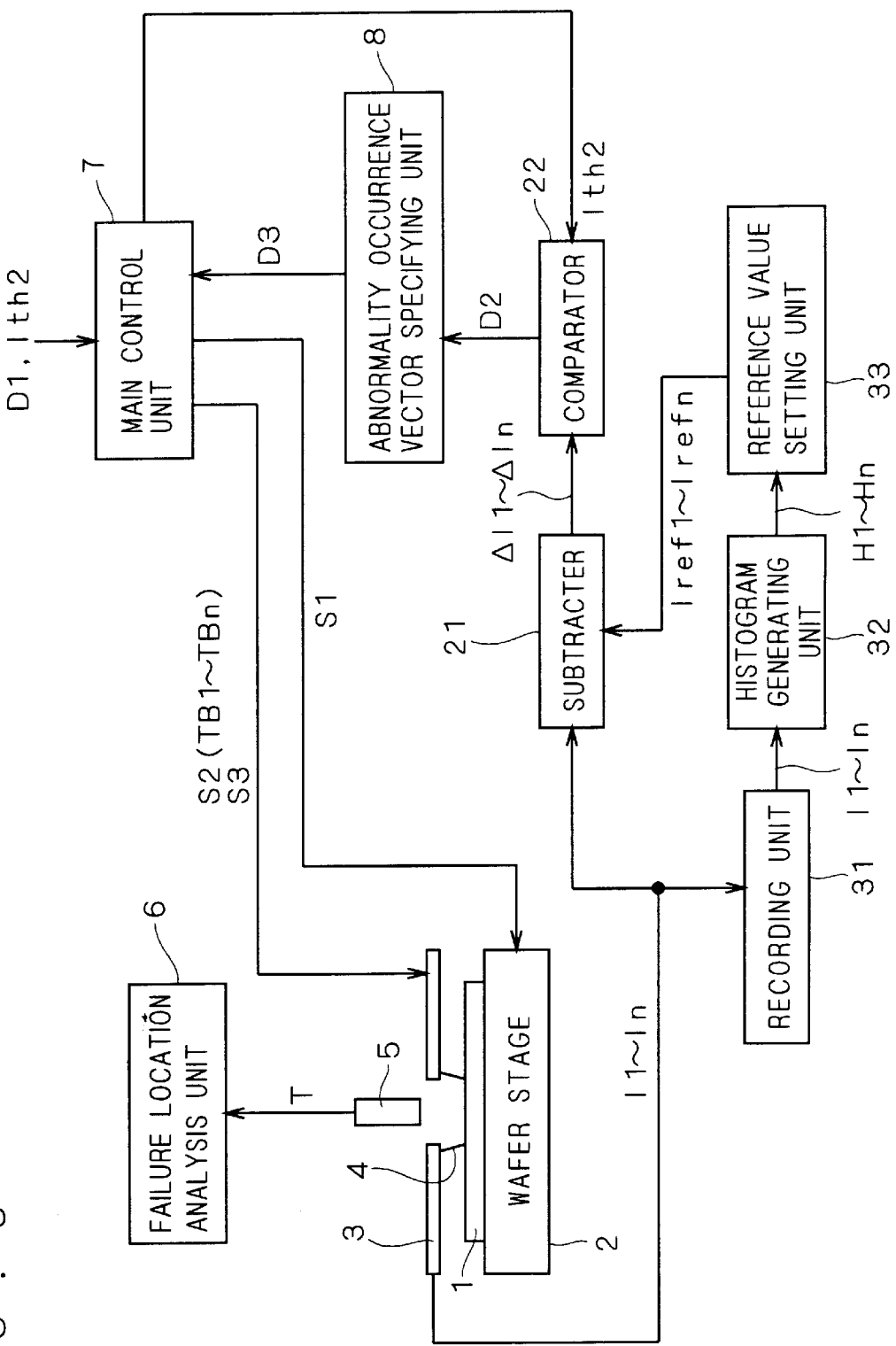
FIG. 8 is a block diagram showing the structure of a failure analysis device according to a third preferred embodiment of the present invention.

FIG. 8 is a block diagram showing the structure of a failure analysis device according to the third preferred embodiment of the present invention. The failure analysis device of the third preferred embodiment is constructed on the basis of the failure analysis device shown in FIG. 4 in the second preferred embodiment and it additionally comprises a recording unit 31 having its input connected to the output of the probe card 3, a histogram generating unit 32 having its input connected to the output of the recording unit 31, and a reference value setting unit 33 having its input connected to the output of the histogram generating unit 32 and its output connected to an input of the subtracter 21. In other respects, the structure of the failure analysis device of the third preferred embodiment is the same as that of the failure analysis device shown in FIG. 4 in the second preferred embodiment.

Figure 9:
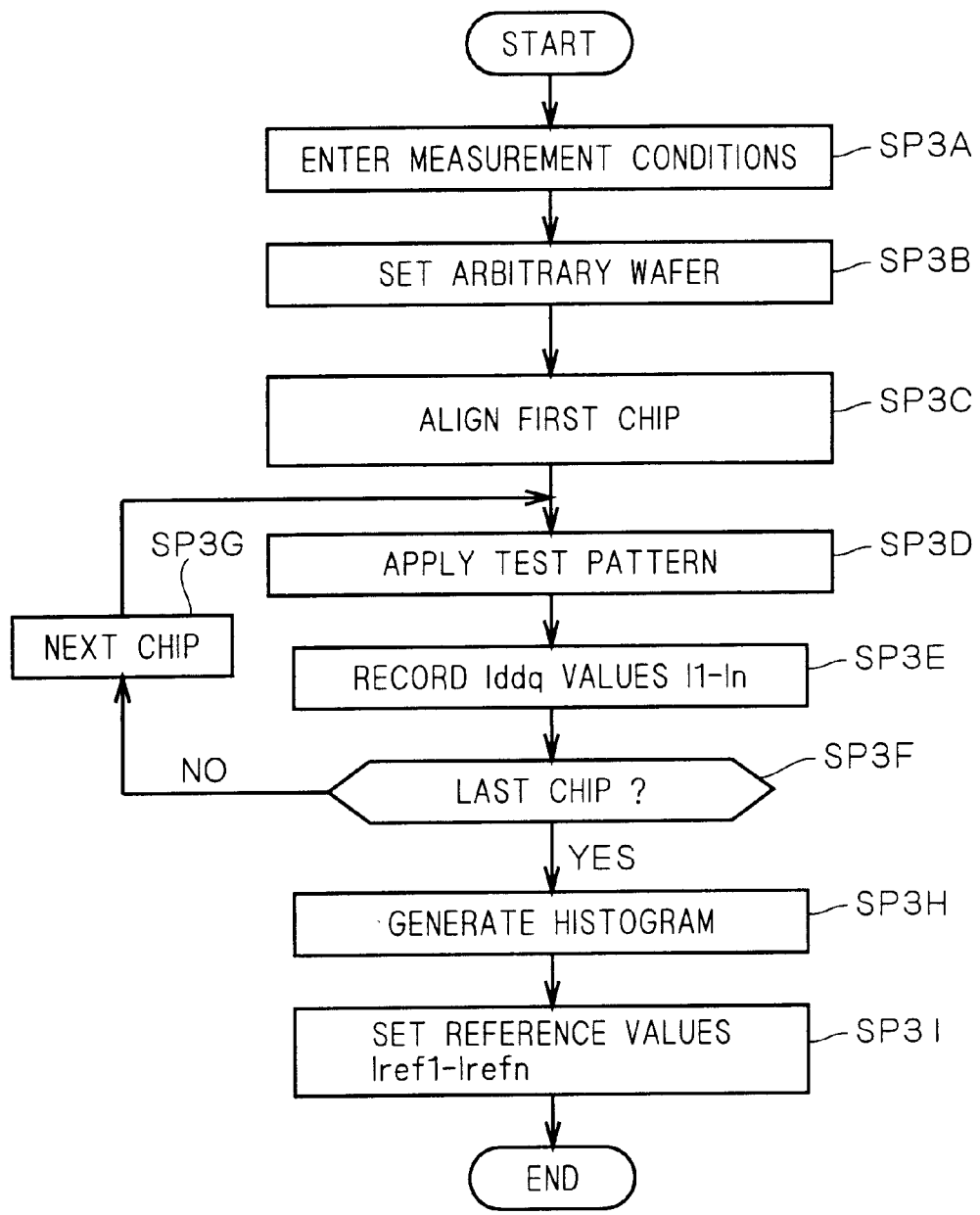
FIG. 9 is a flowchart showing the operation flow for setting reference values in the operation of the failure analysis device of the third preferred embodiment of the invention.

FIG. 9 is a flowchart showing the operation flow for setting the reference values Iref1 to Irefn in the operation of the failure analysis device of the third preferred embodiment. The method of setting the reference values Iref1 to Irefn in the third preferred embodiment is now described referring to FIGS. 8 and 9. First, in the step SP3A, as in the step SP2A of the failure analysis method of the second preferred embodiment, the operator enters measurement conditions into the failure analysis device.

Next, in the step SP3B, one arbitrary wafer 1 (e.g. the first wafer as stated earlier) is taken out from a plurality of wafers specified for test and is placed on the wafer stage 2. Next, in the step SP3C, as in the step SP2C in the failure analysis method of the second preferred embodiment, the first chip is aligned and the probes 4 of the probe card 3 are set into contact with given electrode pads formed on the chip. Next, in the step SP3D, as in the step SP2D in the failure analysis method of the second preferred embodiment, the probe card 3 applies the test pattern composed of a plurality of test vectors TB1 to TBn to the chip.

Next, in the step SP3E, the probe card 3 sequentially detects the quiescent power supply currents which flow when the respective test vectors TB1 to TBn are applied and the recording unit 31 records the detected Iddq values I1 to In.

Next, in the step SP3F, as in the step SP2J in the failure analysis method of the second preferred embodiment, the main control unit 7 checks whether the chip currently in alignment is the last chip. When the decision is "NO," the flow moves to the step SP3G, where the next chip is aligned and the operations in and after the step SP3D are applied to the aligned chip.

When the decision of the step SP3F is "YES," the flow moves to the step SP3H, where the histogram generating unit 32 generates histograms on the basis of the Iddq values I1 to In about all chips and all test vectors TB1 to TBn recorded in the recording unit 31. The histograms are generated for the individual test vectors TB1 to TBn to show the distribution of the numbers of chips with respect to the Iddq values, with the horizontal axis showing the Iddq values and the vertical axis showing the number of chips.

FIG. 10 is a graph showing an example of a histogram generated. The histogram shown in FIG. 10 has been generated about the test vector TB1 on the basis of chips which provide the Iddq values I1 in the range of 0 to 100 $\mu$A (target current range); the range is divided at ten intervals (when defined by the number of divisions) or at the intervals of 10 $\mu$A (when defined by the width of the divisions). The histogram generating unit 32 similarly generates histograms about other test vectors TB2 to TBn.

Next, in the step SP3I, the reference value setting unit 33 obtains the histograms H1 to Hn about the test vectors TB1 to TBn from the histogram generating unit 32 and sets the reference values Iref1 to Irefn on the basis of the respective histograms H1 to Hn. For example, referring to FIG. 10, the reference value setting unit 33 sets the reference value Iref1 on the basis of the current range corresponding to the maximum peak in the histogram H1 (which corresponds to the peak appearing in the current range of 30 to 40 $\mu$A). For example, it sets the reference value Iref1 about the test vector TB1 at the Iddq value of the midmost chip among the plurality of chips contained in this current range (when this current range contains 100 chips, the fiftieth chip).

The reference values Iref can be set on the basis of the current range corresponding to the maximum peak for the following reason. That is to say, when a chip has a failure, the possibility that the leakage current flows in that location in the quiescent state after application of the test vector TB is 50%. It is 50% because the leakage current flows only when a high potential is applied to one of adjacent interconnections and a low potential is applied to the other, while the leakage current does not flow when a high potential is applied to both since in this case no potential difference occurs between the two. In other words, the possibility that the leakage current does not flow even if the chip has a failure location is 50%, too. Further, in normal locations without failure, no large leakage current flows, other than the micro leakage current (Ioff). Therefore, when a wafer contains a certain or larger number of normal chips having no failure, the normal value (the value not containing an increase of leakage current caused by failure) is usually contained in the maximum peak current range. The reference values Iref can thus be set on the basis of the current range corresponding to the maximum peak.

The target current range to be considered to set the reference value Iref is limited to the range between 0 and 100 $\mu$A for the following reason. That is to say, the above-mentioned normal value is not always contained in the maximum peak current range in a low-yield wafer mostly containing faulty chips having failure locations. However, when a chip has failure locations, the leakage current increases by a nearly fixed value (e.g. about 300 $\mu$A) for each failure location, as will be explained later. Therefore, even if the Iddq values have their maximum peak around 300 $\mu$A because of the presence of a large number of faulty chips, the reference value Iref can be appropriately set by limiting the target current range to the range of 0 to 100 $\mu$A.

The reference values Iref1 to Irefn set for the respective test vectors TB1 to TBn are inputted to the subtracter 21 and the subtracter 21 carries out the subtraction as shown in the step SP2E in the failure analysis method of the second preferred embodiment by using the reference values Iref1 to Irefn provided from the reference value setting unit 33.

As explained above, according to the failure analysis device and the failure analysis method of the third preferred embodiment, the reference values Iref1 to Irefn can be automatically set by using the test target wafer 1, in place of obtaining the reference values Iref1 to Irefn by simulation or by actual measurement with normal chips.

Fourth Preferred Embodiment

While the second preferred embodiment has shown an automatic light emission analysis in which the abnormality occurrence vectors are specified on the basis of the differences ΔI1 to ΔIn to detect failure locations, a fourth preferred embodiment shows a failure analysis device and a failure analysis method which estimate the number of failure locations in the chip by using the differences ΔI1 to ΔIn and generate and display a wafer map showing the distribution of the numbers of failure locations in the chips on the wafer surface.

Figure 11:
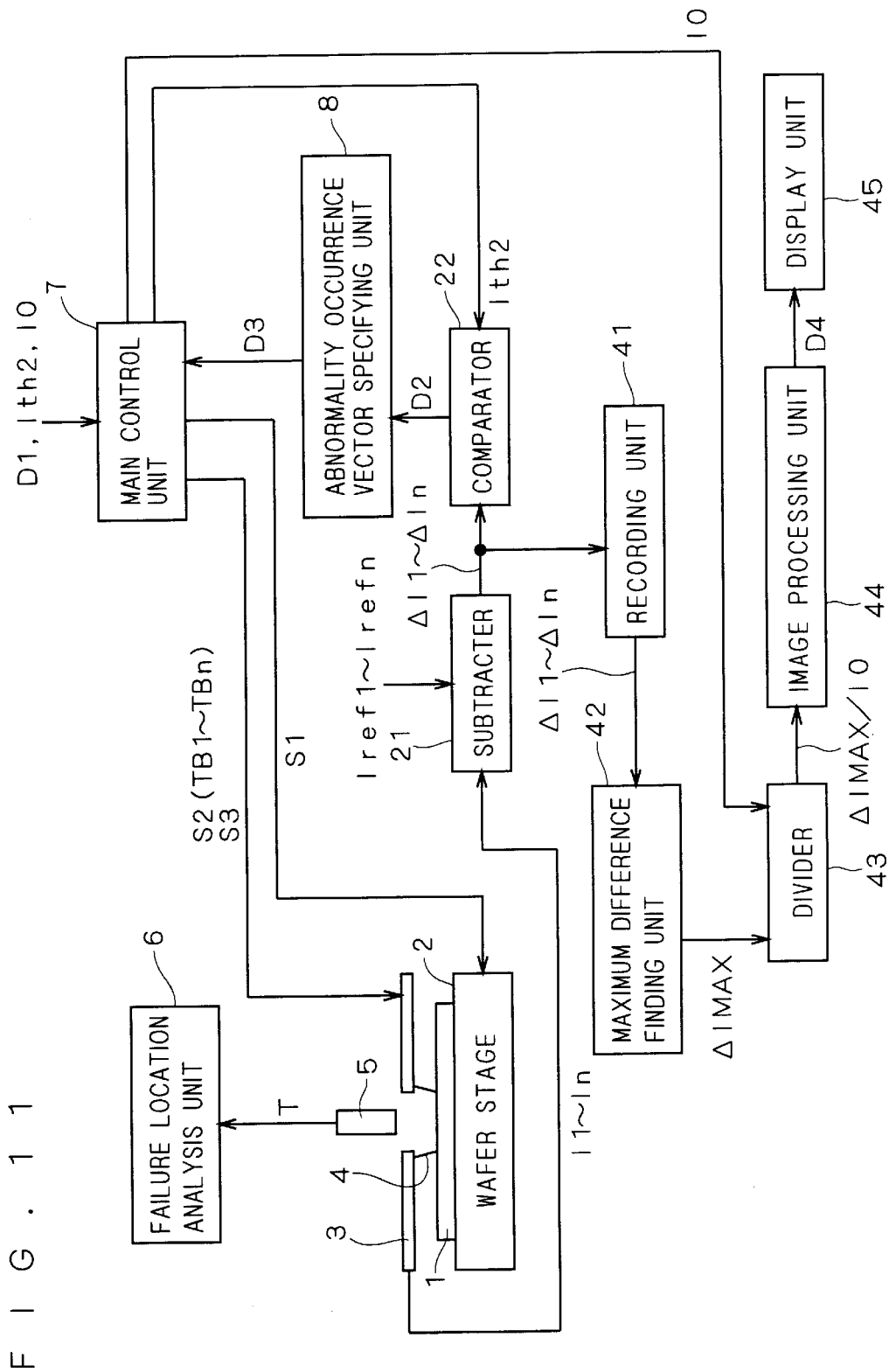
FIG. 11 is a block diagram showing the structure of a failure analysis device according to a fourth preferred embodiment of the present invention.

FIG. 11 is a block diagram showing the structure of a failure analysis device according to a fourth preferred embodiment of the present invention. The failure analysis device of the fourth preferred embodiment is constructed on the basis of the failure analysis device shown in FIG. 4 in the second preferred embodiment, and it additionally comprises: a recording unit 41 having its input connected to the output of the subtracter 21; a maximum difference finding unit 42 having its input connected to the output of the recording unit 41; a divider 43 connected to the main control unit 7 and having its input connected to the output of the maximum difference finding unit 42; an image processing unit 44 having its input connected to the output of the divider 43; and a display unit 45 having its input connected to the output of the image processing unit 44. In other respects, the structure of the failure analysis device of the fourth preferred embodiment is the same as that of the failure analysis device shown in FIG. 4 in the second preferred embodiment.

Figure 12:
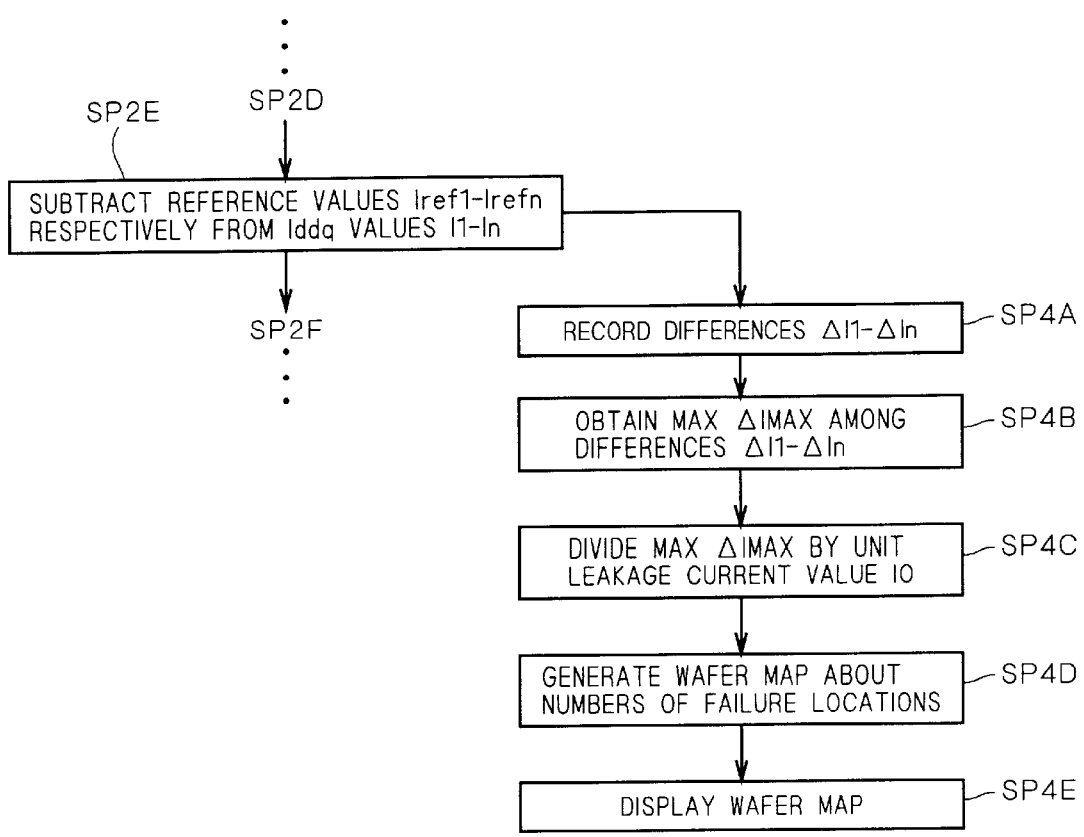
FIG. 12 is a flowchart showing the operation flow for generating and displaying a wafer map in the operation of the failure analysis device of the fourth preferred embodiment of the invention.

FIG. 12 is a flowchart showing the operation flow for generating and displaying a wafer map in the operation of the failure analysis device of the fourth preferred embodiment. The method of generating and displaying a wafer map of the fourth preferred embodiment is now described referring to FIGS. 11 and 12. The subtracter 21 subtracts the reference values Iref1 to Irefn from the Iddq values I1 to In to obtain the differences ΔI1 to ΔIn as shown in the step SP2E in the failure analysis method of the second preferred embodiment, and then the recording unit 41 sequentially receives and records the differences ΔI1 to ΔIn from the subtracter 21 in the step SP4A.

Figure 13:
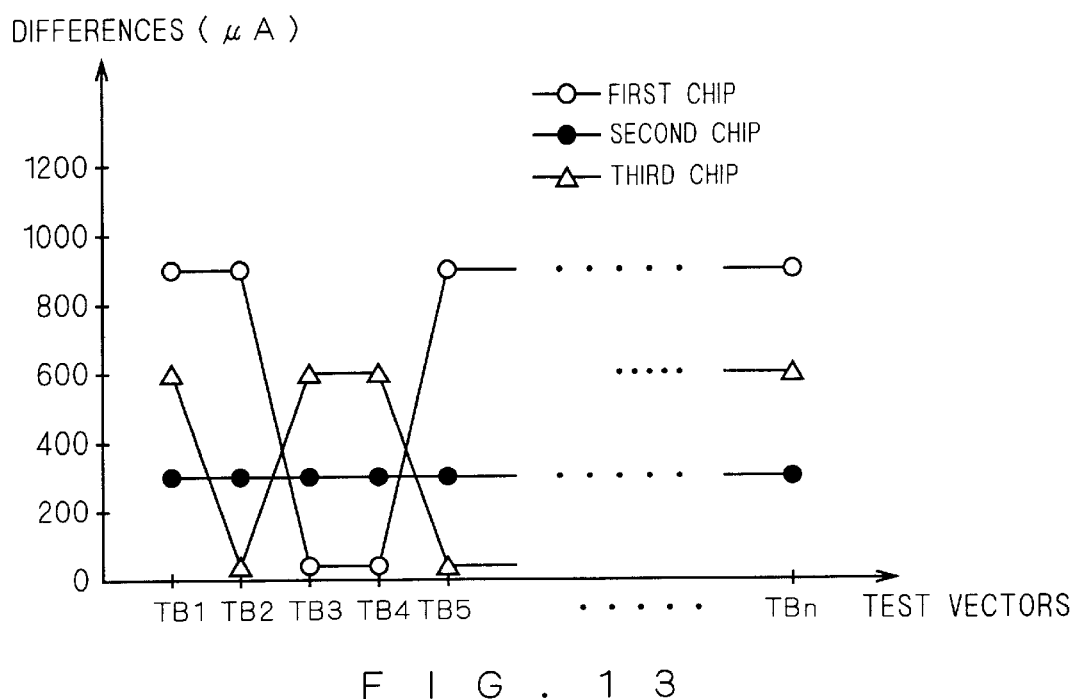
FIG. 13 is a graph used to explain the operation of the maximum difference finding portion.

After the recording unit 41 has recorded the differences ΔI1 to ΔIn about all chips, the maximum difference finding unit 42 receives the differences ΔI1 to ΔIn from the recording unit 41 in the step SP4B and obtains the maximum value ΔIMAX among the differences ΔI1 to ΔIn for each chip. FIG. 13 is a graph used to explain the operation of the maximum difference finding unit 42. In the graph, the horizontal axis shows the test vectors TB1 to TBn and the vertical axis shows the differences ΔI1 to ΔIn. With the first chip, for example, the differences ΔI1, ΔI2, ΔI5 and ΔIn obtained respectively when the test vectors TB1, TB2, TB5 and TBn are applied are about 900 μA and the differences ΔI3 and ΔI4 obtained respectively when the test vectors TB3 and TB4 re applied are about 0 μA. The maximum difference finding unit 42 then determines that the maximum value ΔIMAX about the first chip is 900 μA. Similarly, the maximum difference finding unit 42 determines that the maximum values ΔIMAX about the second and third chips are 300 μA and 600μA, respectively.

Next, in the step SP4C, the divider 43 divides the maximum value ΔIMAX about each chip provided from the maximum difference finding unit 42 by a unit leakage current value I0 provided from the main control unit 7. When a chip has failure locations, the leakage current value caused by the failures increases by a nearly fixed value (e.g. about 300 μA) for each failure location. In this specification, the leakage current value (300μA as shown above) corresponding to an increase caused by one failure location is referred to as "a unit leakage current value." As shown in FIG. 11, the unit leakage current value I0 is entered into the main control unit 7 by the operator while entering the measurement conditions (the step SP2A). The number of failure locations existing in the chip can be estimated by dividing the maximum value ΔIMAX of the differences ΔI by the unit leakage current value I0. For example, since the maximum value ΔIMAX about the first chip is about 900 μA, it can be estimated that the first chip has three failure locations (900 μA/300μA).

Figure 14:
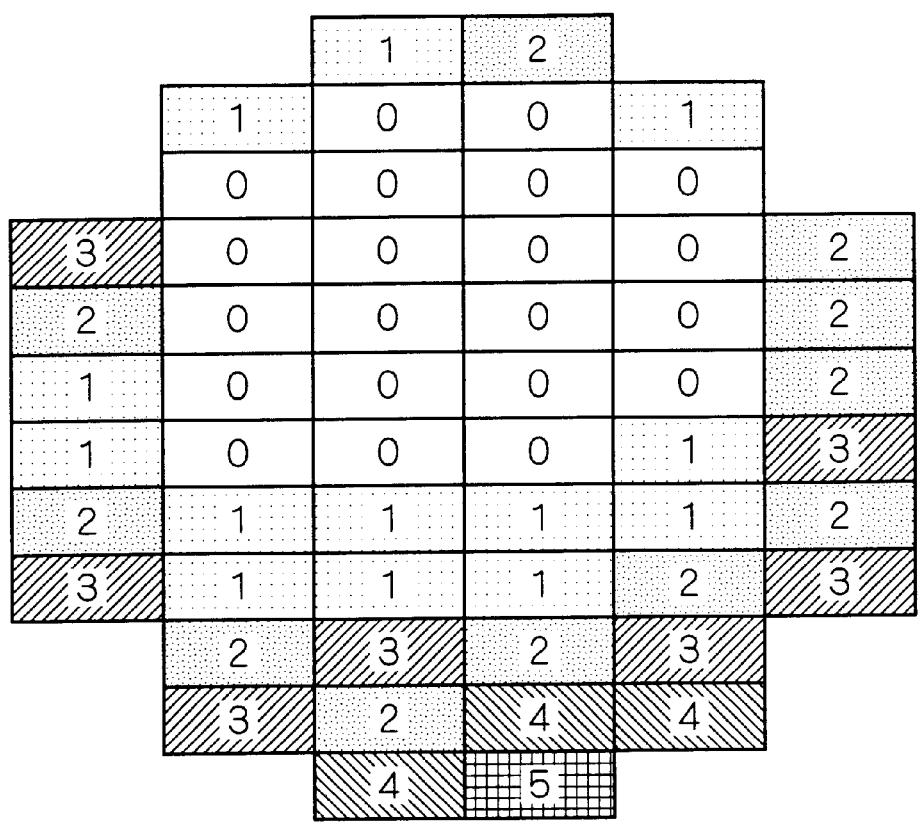
FIG. 14 is a diagram showing an example of a wafer map displayed in the display unit.

Next, in the step SP4D, the image processing unit 44 receives the divided results ΔIMAX/I0 about the individual chips from the divider 43 and generates a wafer map about the numbers of failure locations. Then, in the step SP4E, data D4 about the generated wafer map is provided to the display unit 45 and the display unit 45 displays the wafer map. FIG. 14 is a diagram showing an example of a wafer map displayed in the display unit 45. The wafer map shows an array of chips present on the wafer 1 and the numbers of failure locations estimated for the individual chips on the wafer 1 are displayed in different colors for individual chips.

While the description above has shown an example in which the fourth preferred embodiment is implemented on the basis of the failure analysis device and the failure analysis method of the second preferred embodiment, the fourth preferred embodiment can be implemented also on the basis of the failure analysis device and the failure analysis method of the third preferred embodiment.

As described above, according to the failure analysis device and the failure analysis method of the fourth preferred embodiment, the number of failure locations in each chip is estimated on the basis of the maximum value ΔIMAX among the differences ΔI and the unit leakage current value I0, and a wafer map is generated and displayed in the display unit 45. Therefore it is easy to visually grasp the distribution of failure locations on the wafer 1 by referring to the wafer map.

Fifth Preferred Embodiment

Figure 15:
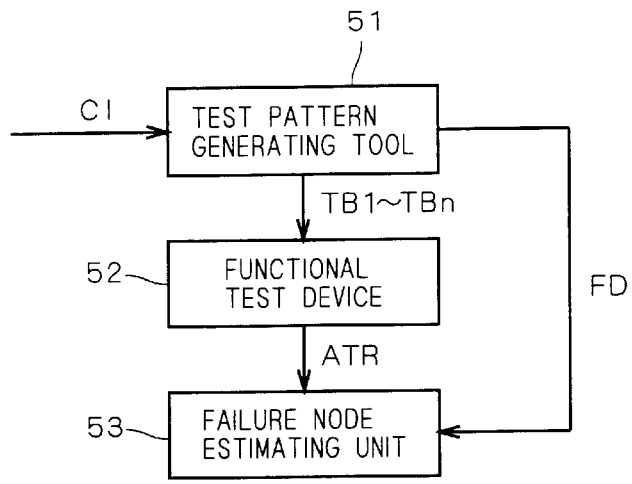
FIG. 15 is a block diagram showing the structure of a known failure analysis device in a simplified manner.

FIG. 15 is a block diagram showing the structure of a known failure analysis device in a simplified manner. This failure analysis device estimates failure nodes on the basis of the results of functional test. The test pattern generating tool 51 generates a test pattern composed of the test vectors TB1 to TBn on the basis of externally provided circuit information CI and also generates a failure dictionary FD (a correspondence table describing the relation between the test pattern and the failure nodes). The functional test device 52 applies functional testing to the chips specified for the test by using the test vectors TB1 to TBn provided from the test pattern generating tool 51. The failure node estimating unit 53 estimates failure nodes on the basis of the test results ATR of the functional test to all test-specified chips provided from the functional test device 52 and the failure dictionary FD provided from the test pattern generating tool 51.

A fifth preferred embodiment shows a failure analysis device which can enhance the accuracy of failure node estimation performed by the failure node estimating unit 53 in the known failure analysis device shown above by utilizing information about the numbers of failure locations in chips estimated by the failure analysis device and the failure analysis method of the fourth preferred embodiment.

Figure 16:
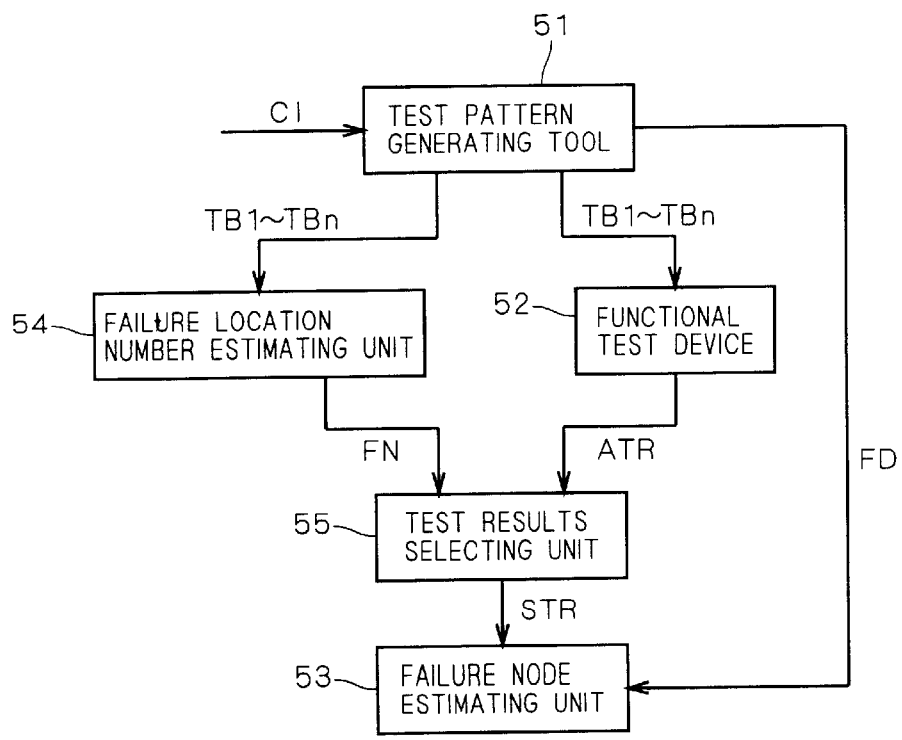
FIG. 16 is a block diagram showing the structure of a failure analysis device according to a fifth preferred embodiment of the present invention.

FIG. 16 is a block diagram showing the structure of a failure analysis device according to the fifth preferred embodiment of the present invention. The failure location number estimating unit 54 at least comprises the main control unit 7, wafer stage 2, probe card 3 having the probes 4, subtracter 21, recording unit 41, maximum difference finding unit 42, and divider 43 in the failure analysis device of the fourth preferred embodiment. It estimates the number of failure locations in each chip on the wafer 1 through the operation explained in the fourth preferred embodiment.

Figure 17:
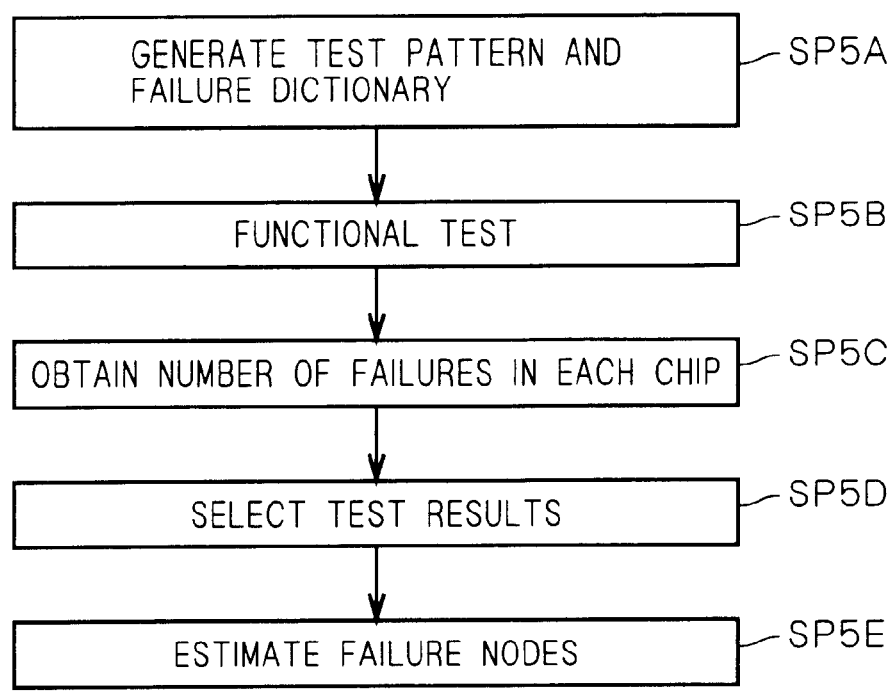
FIG. 17 is a flowchart showing the operation flow of the failure analysis device of the fifth preferred embodiment of the invention.

FIG. 17 is a flowchart showing the operation flow of the failure analysis device of the fifth preferred embodiment. The failure analysis method of the fifth preferred embodiment is now described referring to FIGS. 16 and 17. First, in the step SP5A, the test pattern generating tool 51 generates the test pattern and the failure dictionary FD on the basis of the circuit information CI provided from outside.

Next, in the step SP5B, the functional test device 52 applies functional test to all chips specified for test among a plurality of chips formed on the wafer 1 by using the test pattern provided from the test pattern generating tool 51. Next, in the step SP5C, the failure location number estimating unit 54 estimates the number of failure locations present in each chip on the wafer 1 through the operation explained in the fourth preferred embodiment. The numbers of failure locations are estimated for all chips specified to be tested. This step SP5C may be carried out prior to, or in parallel with, the functional test in the step SP5B.

Next, in the step SP5D, the test result selecting unit 55 refers to the test results ATR of the functional test about all test-specified chips provided from the functional test device 52 and the results FN of the number-of-failure-location estimation in the corresponding chips provided from the failure location number estimating unit 54 and selects test results STR about chips in which the number of failure locations has been estimated to be only one, from among the all test results ATR of the functional test.

Next, in the step SP5E, the failure node estimating unit 53 estimates the failure nodes on the basis of the selected test results STR provided from the test result selecting unit 55 and the failure dictionary FD provided from the test pattern generating tool 51.

As explained above, according to the failure analysis device of the fifth preferred embodiment, the failure node estimating unit 53 receives the test results STR about chips estimated to have only one failure location selected from among all test results ATR of the functional test. The failure node estimating unit 53 then estimates the failure nodes on the basis of the test results STR and the failure dictionary FD.

It is known that the known failure analysis device shown in FIG. 15 can accurately estimate failure nodes in chips having only one failure location but the failure node diagnosis accuracy becomes much lower when the chip has a plurality of failure locations.

According to the failure analysis device of the fifth preferred embodiment, the failure node estimating unit 53 estimates the failure nodes on the basis of the test results STR and the failure dictionary FD, so that the failure node estimating unit 53 can provide improved failure node diagnosis accuracy.

Further, previously knowing the numbers of failure locations offers a possibility that the failure node diagnosis accuracy about chips each having a plurality of failure locations will be also enhanced as well as that about chips each having only one failure location.

Sixth Preferred Embodiment

Figure 18:
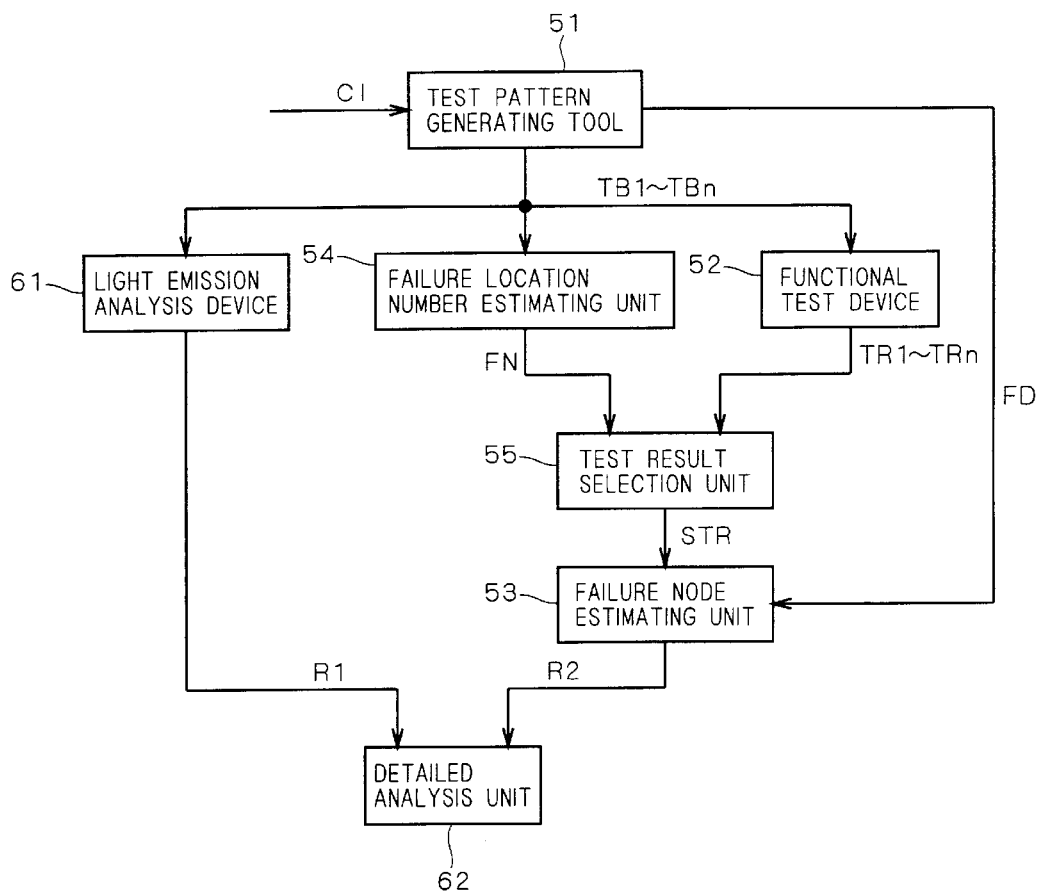
FIG. 18 is a block diagram showing the structure of a failure analysis device according to a sixth preferred embodiment of the present invention.

FIG. 18 is a block diagram showing the structure of a failure analysis device according to a sixth preferred embodiment of the present invention. The light emission analysis device 61 at least comprises the light detecting device 5 and the failure location analysis unit 6 in the structure of the failure analysis device of the fourth preferred embodiment. That is to say, the light emission analysis device 61 and the failure location number estimating unit 54 form the entirety of the failure analysis device of the fourth preferred embodiment.

Figure 19:
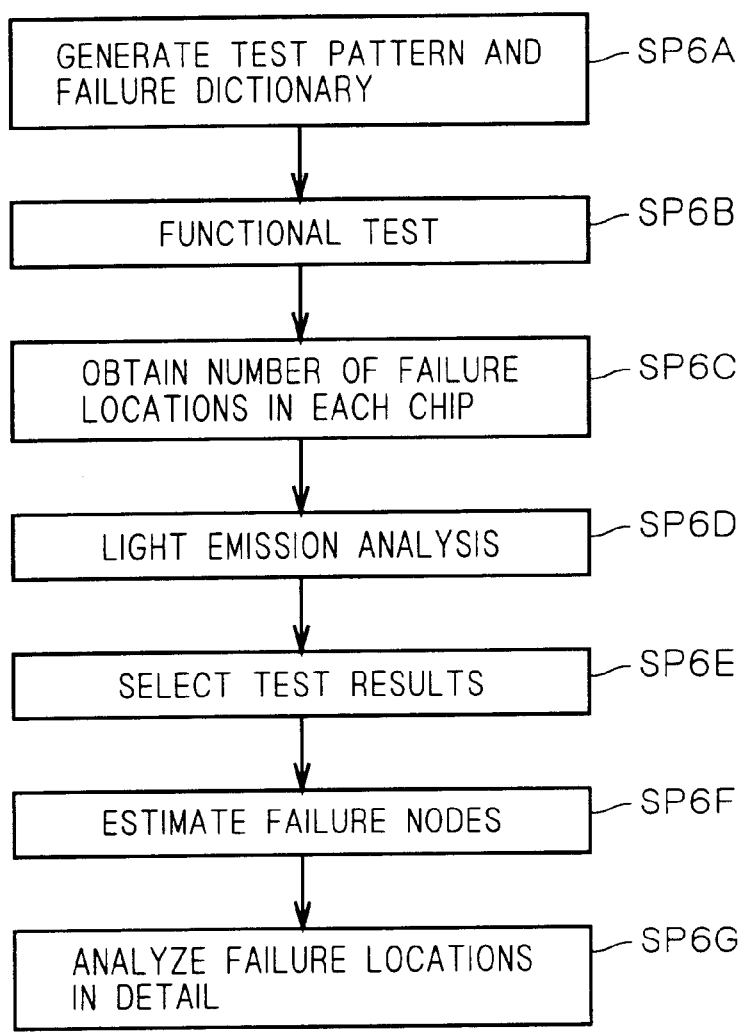
FIG. 19 is a flowchart showing the operation flow of the failure analysis device of the sixth preferred embodiment of the invention.
Figure 20:
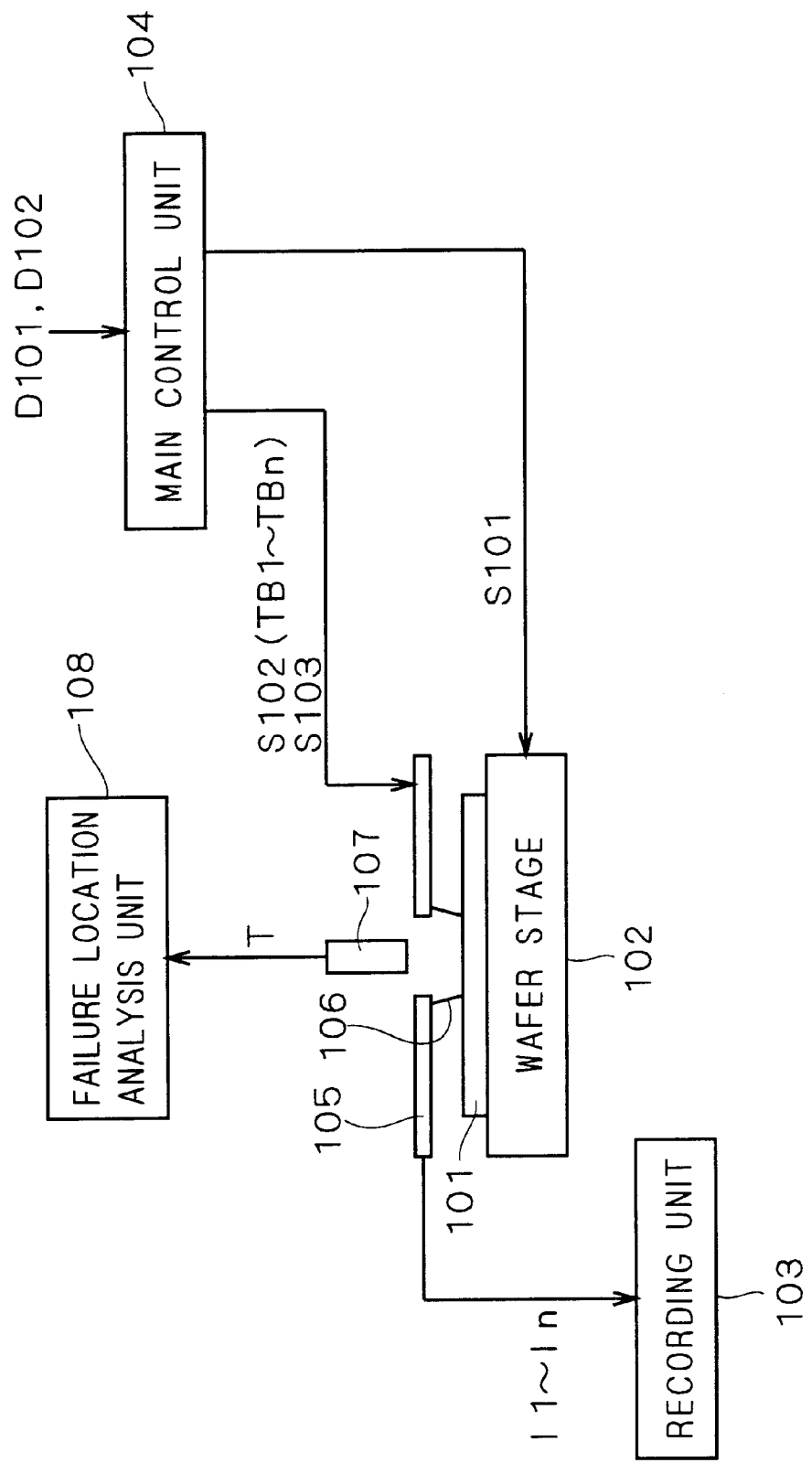
FIG. 20 is a block diagram showing the structure of a conventional failure analysis device.
Figure 21:
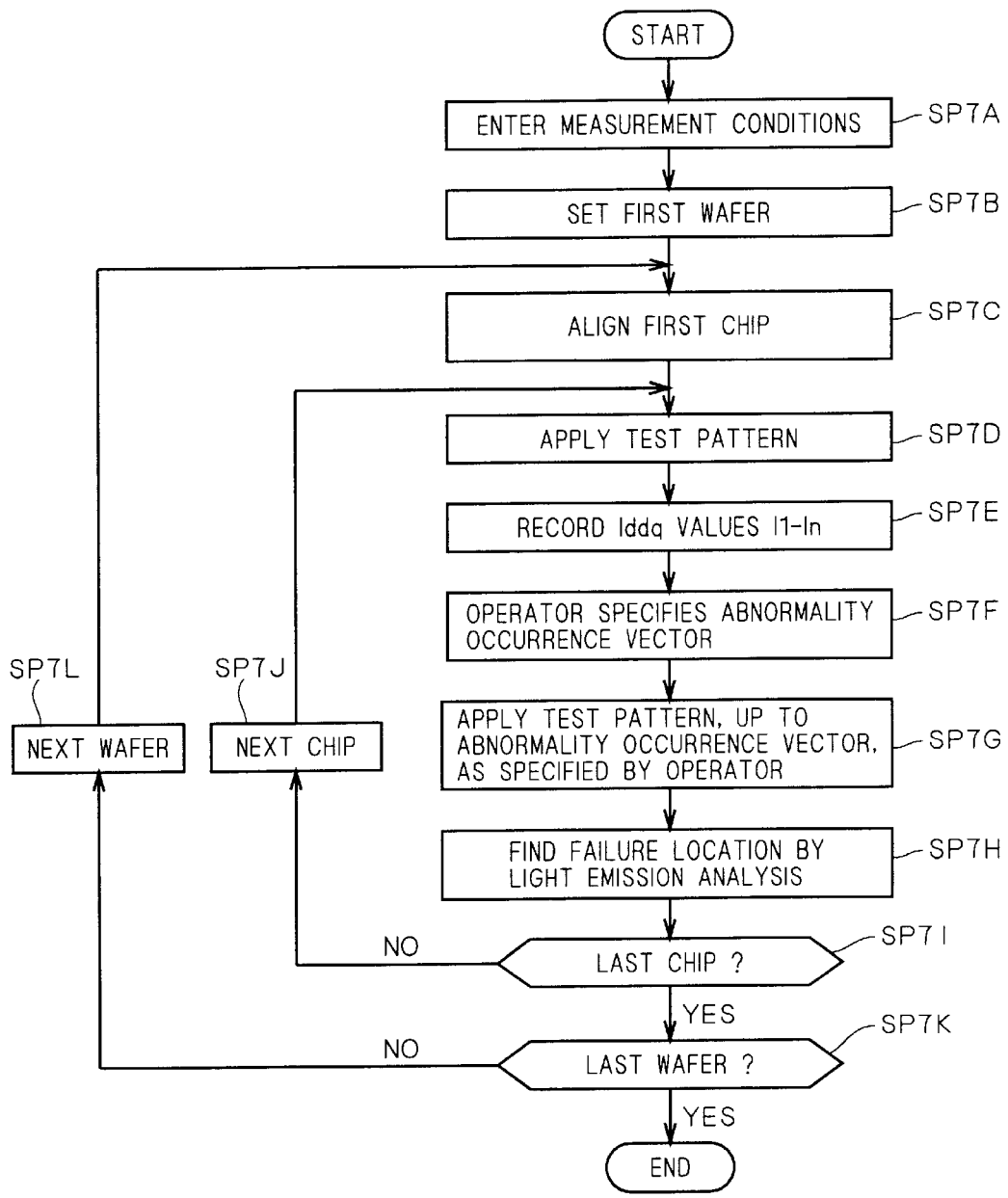
FIG. 21 is a flowchart showing the procedure of light emission analysis with the conventional failure analysis device shown in FIG. 20.
Figure 22:
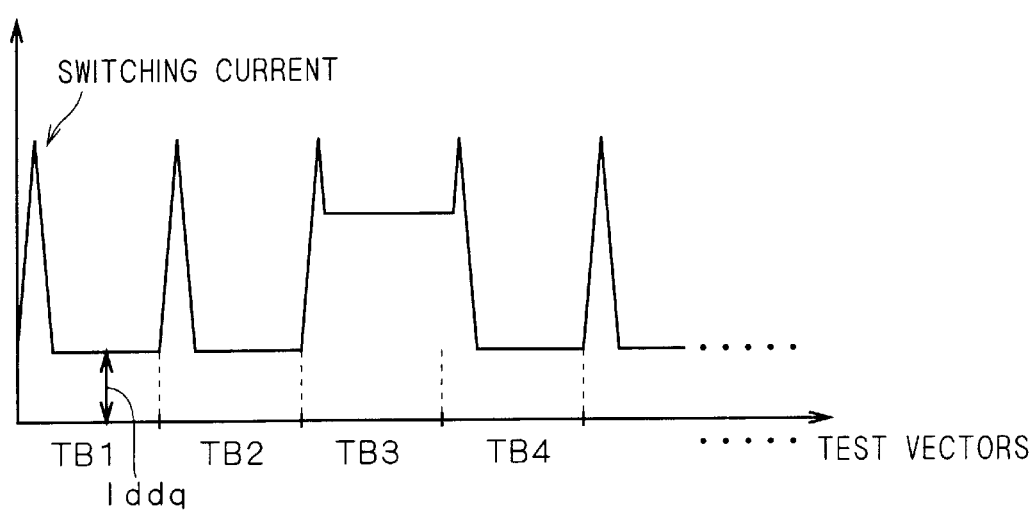
FIG. 22 is a diagram used to explain a method in which an operator specifies an abnormality occurrence vector.

FIG. 19 is a flowchart showing the operation flow of the failure analysis device of the sixth preferred embodiment. The failure analysis method of the sixth preferred embodiment is now described referring to FIGS. 18 and 19. First, in the step SP6A, the test pattern generating tool 51 generates the test pattern and the failure dictionary FD on the basis of the circuit information CI externally provided.

Next, in the step SP6B, the functional test device 52 carries out functional test by utilizing the test pattern provided from the test pattern generating tool 51. Next, in the step SP6C, the failure location number estimating unit 54 estimates the number of failure locations present in each chip on the wafer 1 through the operation explained in the fourth preferred embodiment. Next, in the step SP6D, the light emission analysis device 61 applies light emission analysis to the wafer 1 through the operation explained in the first preferred embodiment. The steps SP6C and SP6D may be performed prior to, or in parallel with, the functional test of the step SP6B.

Next, in the step SP6E, the test result selecting unit 55 selects the test results STR about chips estimated to have only one failure location from among all test results ATR of the functional test through the operation explained in the fifth preferred embodiment. Next, in the step SP6F, the failure node estimating unit 53 estimates the failure nodes on the basis of the test results STR and the failure dictionary FD through the operation explained in the fifth preferred embodiment.

Next, in the step SP6G, the detailed analysis unit 62 analyzes in detail the locations of failure nodes on the basis of the light emission analysis results R1 provided from the light emission analysis device 61 and the failure node estimation results R2 provided from the failure node estimating unit 53.

Now, the light emission analysis results R1 and the failure node estimation results R2 do not always exactly specify the failure locations themselves (the locations where defects exist). Light emission detected by the light emission analysis device 61 may exactly be light emission from a failure location, or may be light emission from a leakage location in a circuit in the preceding or following stage secondarily produced by the failure. Also, nodes estimated to be failures by the failure node estimating unit 53 are nodes determined to be abnormal as a result of some defect, which, by nature, have areas and are not information about points which are uniquely defined. Therefore the accuracy may be insufficient with the light emission analysis results R1 alone, or with the failure node estimation results R2 alone.

On the other hand, in the failure analysis device of the sixth preferred embodiment, the detailed analysis unit 62 analyzes in detail the failure node locations on the basis of the light emission analysis results R1 and the failure node estimation results R2. The light emission analysis results R1 and the failure node estimation results R2 are positional information about the same defects obtained through completely different approaches. Accordingly, the detailed analysis unit 62 can highly accurately locate the failure locations by analyzing the failure locations in detail on the basis a combination of these pieces of information. This enhances the efficiency of failure analysis of logic circuit portions whose failure location analysis is becoming especially difficult due to size reduction and multi-layer structure.

Also, semiconductor device manufacturing methods using the failure analysis methods of the first to sixth preferred embodiments offer improved efficiency in semiconductor device manufacture.

While the invention has been described in detail, the foregoing description is in all aspects illustrative and not restrictive. It is understood that numerous other modifications and variations can be devised without departing from the scope of the invention.

What is claimed is:

1. A failure analysis device comprising:

a test pattern applying portion for applying a test pattern composed of a plurality of test vectors to a test target;

an abnormality occurrence vector specifying portion for specifying an abnormality occurrence vector which can activate a failure present in said test target from among said test pattern on the basis of detected values of quiescent power supply currents which flow in said test target respectively when said plurality of test vectors are applied; and a failure location analysis portion for analyzing the location of said failure in said test target by detecting light emission from said test target with said abnormality occurrence vector applied to said test target.

2. The failure analysis device according to claim 1, wherein said abnormality occurrence vector specifying portion specifies said abnormality occurrence vector on the basis of results of comparison between a given threshold and said detected values of said quiescent power supply currents.

3. The failure analysis device according to claim 1, wherein said abnormality occurrence vector specifying portion specifies said abnormality occurrence vector on the basis of results of comparison between a given threshold and differences between normal values of said quiescent power supply currents which flow in said test target having no failure and said detected values of said quiescent power supply currents.

4. The failure analysis device according to claim 3, further comprising a failure number estimating portion for estimating the number of said failures present in said test target on the basis of said differences.

5. The failure analysis device according to claim 1, wherein said test target is each of a plurality of semiconductor chips formed on a semiconductor wafer, and said abnormality occurrence vector specifying portion specifies said abnormality occurrence vector on the basis of results of comparison between a given threshold and differences between given reference values and said detected values of said quiescent power supply currents, and wherein said failure analysis device further comprises a reference value setting portion for setting said reference values by statistically processing said detected values of said quiescent power supply currents.

6. The failure analysis device according to claim 5, further comprising a failure number estimating portion for estimating the number of said failures present in said test target on the basis of said differences.

7. The failure analysis device according to claim 5, further comprising, a failure number estimating portion for estimating the number of said failures present in said test target on the basis of said differences, and a display portion for displaying a wafer map which shows said number of said failures in each of said plurality of semiconductor chips, said wafer map being generated on the basis of the results of the estimation performed by said failure number estimating portion.

8. A failure analysis device comprising:

a failure number estimating portion for estimating the number of failures present in each of a plurality of semiconductor chips;

a functional test device for carrying out a functional test about said plurality of semiconductor chips by using a test pattern generated on the basis of circuit information about said plurality of semiconductor chips, a test result selecting portion for selecting test results about semiconductor chips in which said number of said failures is estimated to be one from among a plurality of test results of said functional test about said plurality of semiconductor chips on the basis of the results of the estimation performed by said failure number estimating portion; and a failure node estimating portion for estimating failure nodes in said semiconductor chips on the basis of said test results selected by said test result selecting portion and a failure dictionary generated on the basis of said circuit information about said plurality of semiconductor chips.

9. The failure analysis device according to claim 8, further comprising, a light emission analysis device for analyzing locations of said failures in said semiconductor chips by detecting light emission from said semiconductor chips, and a detailed analysis portion for analyzing in detail the locations of said failure nodes on the basis of the results of the analysis performed by said light emission analysis device and the results of the estimation performed by said failure node estimating portion.

10. A failure analysis method comprising the steps of:

(a) applying a test pattern composed of a plurality of test vectors to a test target;

(b) specifying an abnormality occurrence vector which can activate a failure present in said test target from among said test pattern on the basis of detected values of quiescent power supply currents which flow in said test target when said plurality of test vectors are applied; and (c) analyzing the location of said failure in said test target by detecting light emission from said test target with said abnormality occurrence vector applied to said test target.

11. The failure analysis method according to claim 10, wherein in said step (b), said abnormality occurrence vector is specified on the basis of results of comparison between a given threshold and said detected values of said quiescent power supply currents.

12. The failure analysis method according to claim 10, wherein in said step (b), said abnormality occurrence vector is specified on the basis of results of comparison between a given threshold and differences between normal values of said quiescent power supply currents which flow in said test target having no failure and said detected values of said quiescent power supply currents.

13. The failure analysis method according to claim 12, further comprising a step (e) of estimating the number of said failures present in said test target on the basis of said differences.

14. The failure analysis method according to claim 10,
wherein said test target is each of a plurality of semiconductor chips formed on a semiconductor wafer, and
in said step (b), said abnormality occurrence vector is specified on the basis of results of comparison between a given threshold and differences between given reference values and said detected values of said quiescent power supply currents,
and wherein said failure analysis method further comprises a step (d) of setting said reference values by statistically processing said detected values of said quiescent power supply currents.

15. The failure analysis method according to claim 14, further comprising a step (e) of estimating the number of said failures present in said test target on the basis of said differences.

16. The failure analysis method according to claim 14, further comprising the steps of,
(e) estimating the number of said failures present in said test target on the basis of said differences, and
(f) displaying a wafer map which shows said number of said failures in each of said plurality of semiconductor chips, said wafer map being generated on the basis of the results of the estimation performed in said step (e).

* * * * *